(12) United States Patent
Katoh et al.

(10) Patent No.: US 8,102,696 B2
(45) Date of Patent: Jan. 24, 2012

(54) NONVOLATILE MEMORY DEVICE AND METHOD OF WRITING DATA TO NONVOLATILE MEMORY DEVICE

(75) Inventors: Yoshikazu Katoh, Osaka (JP); Kazuhiko Shimakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 190 days.

(21) Appl. No.: 12/677,421

(22) PCT Filed: Aug. 25, 2008

(86) PCT No.: PCT/JP2008/002291
§ 371 (c)(1),
(2), (4) Date: Mar. 10, 2010

(87) PCT Pub. No.: WO2009/034687
PCT Pub. Date: Mar. 19, 2009

(65) Prior Publication Data
US 2010/0202185 A1    Aug. 12, 2010

(30) Foreign Application Priority Data
Sep. 10, 2007 (JP) ................................. 2007-233804

(51) Int. Cl.
*G11C 11/00* (2006.01)

(52) U.S. Cl. ........................................ 365/148; 365/163

(58) Field of Classification Search .................. 365/148, 365/163, 184
See application file for complete search history.

(56) References Cited

U.S. PATENT DOCUMENTS

| 6,597,598 B1 * | 7/2003 | Tran et al. ........................ 365/94 |
| 6,847,544 B1 * | 1/2005 | Smith et al. .................... 365/158 |
| 2004/0114429 A1 | 6/2004 | Ehiro et al. |
| 2005/0174854 A1 | 8/2005 | Tsushima et al. |
| 2006/0044878 A1 | 3/2006 | Perner |
| 2007/0165442 A1 | 7/2007 | Hosoi et al. |
| 2008/0123393 A1 | 5/2008 | Kinoshita |

FOREIGN PATENT DOCUMENTS

| JP | 2004-185756 | 7/2004 |
| JP | 2005-216387 | 8/2005 |
| JP | 2006-073010 | 3/2006 |
| JP | 2006-294182 | 10/2006 |
| JP | 2007-188603 | 7/2007 |
| WO | WO 2006/137111 A1 | 12/2006 |

OTHER PUBLICATIONS

Baek, I.G., et al., "Highly Scalable Non-volatile Resistive Memory using Simple Binary Oxide Driven by Asymmetric Unipolar Voltage Pulses", 2004, IEEE.

* cited by examiner

*Primary Examiner* — Vu Le
(74) *Attorney, Agent, or Firm* — McDermott Will & Emery LLP

(57) ABSTRACT

A nonvolatile memory device (300) is provided, including a memory cell array having plural resistance variable elements which are switchable between plural resistance states in response to electric pulses with the same polarity. A series resistance setting unit (310) is provided between the memory cell array (70) and an electric pulse application unit (50). The series resistance setting unit is controlled to change a resistance value of a series current path with a predetermined range with time in at least one of a case where the selected resistance variable element is switched from a low-resistance state to a high-resistance state and a case where the selected resistance variable element is switched from the high-resistance state to the low-resistance state.

8 Claims, 15 Drawing Sheets

//NONVOLATILE MEMORY DEVICE AND METHOD OF WRITING DATA TO NONVOLATILE MEMORY DEVICE

RELATED APPLICATIONS

This application is the U.S. National Phase under 35 U.S.C. §371 of International Application No. PCT/JP2008/002291, filed on Aug. 25, 2008, which in turn claims the benefit of Japanese Application No. 2007-233804, filed on Sep. 10, 2007, the disclosures of which Applications are incorporated by reference herein.

TECHNICAL FIELD

The present invention relates to a nonvolatile memory device and a method of writing data to the nonvolatile memory device. More particularly, the present invention relates to a nonvolatile memory device configured to write data to resistance variable elements utilizing a difference in a voltage level of electric pulses with the same polarity, and a method of writing data to the nonvolatile memory device.

BACKGROUND ART

Nonvolatile memory devices are commonly mounted in portable apparatus such as cellular phones or digital cameras and the use of them has been spreading at a rapid pace. In recent years, in many occasions, audio data and image data are used. Accordingly, there has been a strong demand for nonvolatile memory devices which have larger capacities and are operable at higher speeds. Furthermore, in fields of nonvolatile memory devices for use with portable apparatus, a demand for lower electric power consumption has been increasing.

At present, a major nonvolatile memory device is a flash memory. The flash memory is configured to control electric charges accumulated on a floating gate to store data. It has been pointed out that since the flash memory has a structure for accumulating electric charges on the floating gate in a high electric field, there is a limitation on reduction of the size, and it is difficult to miniaturize the flash memory, which is required to achieve a larger capacity. In addition, in the flash memory, specified blocks must be erased all at once for rewriting. Because of such a property, the flash memory requires a very long time for rewriting and has a limitation on an increase in the speed.

As a nonvolatile memory device in next generation which has a potential to solve the above mentioned problems, there is a nonvolatile memory device which incorporates resistance variable elements for storing data according to switching of electric resistance. As nonvolatile memories using resistance variable elements proposed currently, there are a MRAM (magnetic RAM), PRAM (phase-change RAM), ReRAM (resistive RAM), etc.

Patent document 1 discloses an exemplary control method of the ReRAM element using an oxide of a perovskite structure. Now, the control method of the ReRAM element will be described with reference to the drawings.

FIGS. 12 to 14 are views showing the control method of the memory cell disclosed in Patent document 1. A memory cell 9 includes a resistance variable element 1 and a select transistor 2. One terminal of the resistance variable element 1 is electrically connected to one main terminal (drain or source) of the select transistor 2. The other main terminal (source or drain) of the select transistor 2 is electrically connected to a source line terminal 3 via a source line 6. The other terminal of the resistance variable element 1 is electrically connected to a bit line terminal 5 via a bit line 8. A gate of the select transistor 2 is electrically connected to a word line terminal 4 via a word line 7. In any of the cases where data is written ("1" is written), data is erased ("0" is written) and data is read, a high-level ON-voltage is applied to the word line terminal 4 of the selected memory cell, placing the select transistor 2 in an electrically conductive state.

FIG. 12 is a view showing a state of application of voltage pulses when a write operation occurs in the memory cell of Patent document 1. The source line 6 is set to 0V (electrically grounded), and a positive write pulse having a predetermined write voltage amplitude is applied to the bit line 8 to write desired data to the resistance variable element 1. In the case where multi-valued data is written to the resistance variable element 1, a voltage amplitude of a write pulse is set to a level according to the value of data to be written. For example, in the case where four-valued data is written to one resistance variable element 1, one voltage amplitude is selected from among specified four voltage amplitudes determined to respectively correspond to the values of the write data and a write operation is performed. As a write pulse width, a proper width according to the element is selected. That is, to switch the element 1 to a predetermined resistance state, one voltage amplitude level and one pulse width corresponding to the resistance state exist.

FIG. 13 is a view showing a state of application of voltage pulses when an erase operation occurs in the memory cell of Patent document 1. The bit line is set to 0V (electrically grounded) and a positive erase pulse having a predetermined erase voltage amplitude is applied to the source line. Upon the application of the erase pulse, the electric resistance of the resistance variable element 1 is caused to have a minimum value. Patent document 1 discloses that, upon application of the erase pulse to a specified source line with plural bit lines set to 0V, data are erased all at once from plural memory cells connected to the plural bit lines and to the source line.

FIG. 14 is a view showing a state of application of a voltage pulse during a read operation in the memory cell of Patent document 1. When reading data stored in the resistance variable element 1, the source line 6 is set to 0V (electrically grounded), and a predetermined read voltage is applied to the selected bit line 8 via a read circuit. Upon application of the read voltage, a comparator/determiner circuit compares a level of the bit line 8 to a reference level for reading, and stored data is read. Non-patent document 1 discloses a ReRAM element configured to transition between a high-resistance state and a low-resistance state by application of voltage pulses having the same polarity and different voltages and pulse widths. TMO (transition metal oxide) is used as a resistance variable material for the ReRAM element of Non-patent document 1. The ReRAM element can be switched to a high-resistance state or to a low-resistance state in response to the electric pulses with the same polarity. FIG. 15 is a view showing a voltage-current characteristic of the ReRAM element of Non-patent document 1. As shown in FIG. 15, in "SET" in which the element is switched from the high-resistance state to the low-resistance state, a more current than before flows when the element has been switched from the high-resistance state to the low-resistance state unless a set current compliance is used. In this case, the element would switch back from the low-resistance state to the high-resistance state unexpectedly (incorrect operation), or would be broken down due to an excess current. Therefore, it is necessary to use Set Current Compliance at a predetermined first current value. In "reset" in which the element is switched from the low-resistance state to the high-resistance state, a current of a second value which is not smaller than the first current value flows.

As should be understood from above, for the ReRAM element which is switchable to the high-resistance state or to the low-resistance state by application of the voltages with the same polarity, it is necessary to control a driver circuit for causing switching of the resistance state so that the first current value or the second current value is selectively used, according to the resistance state of the element.

Patent document 1: Japanese Laid-Open Patent Application Publication No. 2004-185756

Non-patent document 1: Baek, J. G. et al., 2004, "Highly Scalable Non-volatile Resistive Memory using Simple Binary Oxide Driven by Asymmetric Unipolar Voltage Pulses", 0-7803-8684-1/04/$20.00IEEE

DISCLOSURE OF THE INVENTION

Problems to be Solved by the Invention

When a memory cell array is actually constructed in the conventional configuration, the device tends to operate with low reliability and a life of the device tends to be short.

The present invention has been developed to solve the above described problem, and an object of the present invention is to improve reliability of an operation and extend a life of a nonvolatile memory device having a memory cell array including plural resistance variable elements which are switchable between plural resistance states in response to electric pulses with the same polarity.

Means for Solving the Problems

The present inventors studied intensively to improve reliability of operation and to extend life of the nonvolatile memory device including the resistance variable elements and understood the following.

When plural resistance variable elements are arranged in array to form a memory cell array, there is a variation in the characteristics of the resistance variable elements, due to a manufacturing process, and others. In many occasions, parasitic resistance including wire resistance and select transistors are non-negligible. Because of this, the voltage actually applied to the resistance variable elements varies from element to element, even though the same voltage is applied to the array. In this case, some resistance variable elements would not switch their resistance values in response to predetermined voltages, thereby resulting in reduced operation reliability.

The voltage to be applied to the resistance variable elements may be set comparatively higher on the basis of the resistance variable element which switches the resistance value by the highest voltage to enable all of the resistance variable elements to surely switch the resistance values. In such a configuration, however, a higher voltage is applied to the resistance variable element which switches the resistance value by a lower voltage, and an electrical stress applied to the resistance variable element increases, which leads to a shorter life of the device.

In view of the understanding, the inventors conceived that the resistance value of a current path connected in series with the resistance variable element is changed within a predetermined range with time so that the voltage applied to the resistance variable element is within a predetermined range from a lower limit of a variation distribution of the voltage for causing switching of the resistance value of the resistance variable element to an upper limit of the variation distribution in at least one of a case where the resistance variable element is switched from the low-resistance state to the high-resistance state and a case where the resistance variable element is switched from the high-resistance state to the low-resistance state. In this manner, an optimal write voltage for every individual resistance variable element is automatically selected. As a result, reliability of the operation can be improved by surely switching the resistance state of each resistance variable element and the life of the device can be extended by preventing an unnecessary electrical stress from being applied to the element.

To achieve the above described object, a nonvolatile memory device of the present invention comprises: a memory cell array including plural resistance variable elements each of which has a first terminal and a second terminal and is configured to store data based on switching in an electric resistance between the first terminal and the second terminal; an electric pulse application circuit which includes a first output terminal and a second output terminal and is configured to output an electric pulse between the first output terminal and the second output terminal; a select circuit which is configured to select a desired resistance variable element from resistance variable elements in the memory cell array as a selected resistance variable element, electrically connect the first terminal of the selected resistance variable element to the first output terminal, and electrically connect the second terminal of the selected resistance variable element to the second output terminal; a series resistance setting unit configured to set a resistance value of a series current path as desired, the series current path being a current path electrically connecting the first output terminal to a reference node, the reference node being a point on a current path connecting the first output terminal to the first terminal of the selected resistance variable element, a potential between the second output terminal and the reference node being a node potential; and a control circuit configured to control the series resistance setting unit to set the resistance value of the series current path; wherein the node potential is obtained by dividing a voltage between the first and second output terminals by at least the resistance value of the series resistance setting unit and the resistance value of the selected resistance variable element; wherein each of the resistance variable elements has a characteristic in which the resistance variable element in a low-resistance state switches to a high-resistance state in which a resistance value of the resistance variable element is higher than a resistance value of the resistance variable element in the low-resistance state, when the node potential is higher in absolute value than a first voltage level corresponding to each of the resistance variable elements, and the resistance variable element in the high-resistance state switches from the high-resistance state to the low-resistance state when the node potential is higher in absolute value than a second voltage level which is identical in polarity to the first voltage level, corresponds to each of the resistance variable elements and is higher in absolute value than the first voltage level; and wherein the control circuit is configured to perform control for at least one of: (A) changing the resistance value of the series current path within a predetermined range with time so that the node potential falls within a predetermined range between a lower limit of a variation distribution of the first voltage level in the memory cell array and an upper limit of the variation distribution when the resistance variable element is switched from the low-resistance state to the high-resistance state; and (B) changing the resistance value of the series current path within a predetermined range with time so that the node potential falls within a predetermined range between a lower limit of a variation distribution of the second voltage level in the memory cell array and an upper limit of the variation distribution when the resistance variable element is switched from the high-resistance state to the low-resistance state.

In such a configuration, in the nonvolatile memory device including the memory cell array having plural resistance variable elements which are switchable between plural resistance states in response to electric pulses with the same polarity, it is possible to apply an optimal voltage electric pulse to every individual resistance variable element in view of a difference in characteristic which is generated due to a variation in the resistance variable elements which occurs during a manufacturing process or a difference between the positions of the resistance variable elements on the memory cell array. As a result, reliability of the operation of the nonvolatile memory device can be improved and the life of the device can be extended.

The nonvolatile memory device may further comprise a parallel current path for electrically connecting the reference node to the second output terminal in parallel with the resistance variable element; and a parallel resistance setting unit for setting a resistance value of the parallel current path as desired. The control circuit may be configured to control the parallel resistance setting unit such that the resistance value of the parallel current path is changed within a predetermined range with time to selectively adjust the node potential in at least one of a case where the resistance variable element is switched from the low-resistance state to the high-resistance state and a case where the resistance variable element is switched from the high-resistance state to the low-resistance state.

In such a configuration, the node potential can be controlled by properly controlling the resistance value of the current path provided in parallel with the resistance variable element. As a result, reliability of the operation of the nonvolatile memory device can be further improved and the life of the device can be further extended.

In the nonvolatile memory device, the series resistance setting unit may include plural resistive elements, and may be configured to selectively connect one of the plural resistive elements in parallel with the series current path to change the resistance value of the series current path in a step form within the predetermined range with time.

In such a configuration, it is possible to change the resistance value of the series current path in a step form within the predetermined range with a simple configuration in which the nonvolatile memory device includes plural resistive elements.

The nonvolatile memory device may further comprise a controller being configured to control the series resistance setting unit to change the resistance value of the series current path within the predetermined range with time during a time period from when application of the electric pulse to the resistance variable element starts until the application of the electric pulse completes in at least one of the case where the resistance variable element is switched from the low-resistance state to the high-resistance state and the case where the resistance variable element is switched from the high-resistance state to the low-resistance state.

In such a configuration, it is possible to apply an optimal voltage electric pulse to every individual resistance variable element with a simple method for changing the resistance value of the series current path when the electric pulse is applied to the resistance variable element to switch the element to the high-resistance state or to the low-resistance state.

The nonvolatile memory device may further comprise a controller being configured to change the resistance value of the series current path in a step form within the predetermined range with time and configured to cause the electric pulse application unit to output a predetermined electric pulse at each time when the resistance value of the series current path is changed in one step in at least one of the case where the resistance variable element is switched from the low-resistance state to the high-resistance state and the case where the resistance variable element is switched from the high-resistance state to the low-resistance state.

In such a configuration, it is possible to apply an optimal voltage electric pulse to every individual resistance variable element with a simple method for changing the resistance value of the series current path when the electric pulse is applied to each resistance variable element.

In the nonvolatile memory device, a current path including the resistance variable element and electrically connecting the reference node to the second output terminal via the resistance variable element is a resistance switching current path, and a current path electrically connecting the reference node to the second output terminal in parallel with the resistance switching current path is a parallel current path; the nonvolatile memory device further comprising: a parallel resistance setting unit for setting a resistance value of the parallel current path; wherein the series resistance setting unit is configured to set the resistance value of the series current path and the parallel resistance setting unit is configured to set the resistance value of the parallel current path so that: the resistance value of the series current path, the resistance value of the parallel current path, a resistance value of the resistance switching current path in a state where the resistance variable element is in the high-resistance state and a resistance value of the resistance switching current path in a state where the resistance variable element is in the low-resistance state are set to values so that: the node potential is not lower in absolute value than the first voltage level when the electric pulse application unit is outputting a first electric pulse in a state where the resistance variable element is in the low-resistance state; the node potential is not lower in absolute value than the second voltage level when the electric pulse application unit is outputting a second electric pulse in a state where the resistance variable element is in the high-resistance state; after the resistance variable element in the low-resistance state has switched to the high-resistance state in response to the first electric pulse output from the electric pulse application unit, the node potential is lower in absolute value than the second voltage level even though the electric pulse application unit is outputting the first electric pulse; and after the resistance variable element in the high-resistance state has switched to the low-resistance state in response to the second electric pulse output from the electric pulse application unit, the node potential is lower in absolute value than the first voltage level even though the electric pulse application unit is outputting the second electric pulse.

In such a configuration, it is possible to provide a nonvolatile memory device which does not require erasing data all at once when writing data and can improve a processing speed. It is possible to surely avoid an incorrect operation or break down of the element when writing data with a simple configuration in which the resistance variable elements which are switchable between plural resistance states in response to the electric pulses with same polarity are used.

In the nonvolatile memory device, a variation distribution of the first voltage level in the memory cell array overlaps with a variation distribution of the second voltage level in the memory cell array, and the nonvolatile memory device further comprise a resistance switching detector for detecting that the resistance variable element selected by the selector unit has switched from the low-resistance state to the high-resistance state; and a controller. The controller may be configured to cause the series resistance setting unit to change the resistance value of the series current path within the predetermined range with time such that the node potential gradually increases from a lower limit of the variation distribution of the first voltage level in the memory cell array, and cause the resistance switching detector to monitor the resistance state of the resistance variable element. The controller may be configured to stop inputting of the electric pulse to the resistance variable element or stop changing of the resistance value of the series current path, when the resistance switching detector detects that the resistance variable element has switched to the high-resistance state.

In such a configuration, even when the variation distribution of the high-resistance state attaining voltage in the memory cell array and the variation distribution of the low-resistance state attaining voltage in the memory cell array overlap with each other, it is possible to avoid an incorrect operation in which the resistance variable element switches back to the low-resistance state after the resistance variable element has switched from the low-resistance state to the high-resistance state. As a result, reliability of the operation of the nonvolatile memory device can be further improved.

A method of writing data to a nonvolatile memory device of the present invention, is a method of writing data to the nonvolatile memory device including: a memory cell array including plural resistance variable elements for storing data based on switching of electric resistance; an electric pulse application unit including a first output terminal and a second output terminal and configured to output an electric pulse between the first output terminal and the second output terminal; and a selector unit which is connected to the first output terminal and configured to select a desired resistance variable element from resistance variable elements in the memory cell array and connect the selected resistance variable element to the first output terminal; wherein a current path electrically connecting the first output terminal to a reference node is a series current path, the reference node being a point on a current path connecting the first output terminal to the selector unit; each of the resistance variable elements has a characteristic in which, in a state where the resistance variable element is in the low-resistance state, the resistance variable element switches to a high-resistance state in which a resistance value of the resistance variable element is higher than a resistance value of the resistance variable element in the low-resistance state, when a node potential which is a potential of the reference node on the basis of the second output terminal is higher in absolute value than a first voltage level corresponding to the resistance variable element; and in a state where the resistance variable element is in the high-resistance state, the resistance variable element switches from the high-resistance state to the low-resistance state when the node potential is higher in absolute value than a second voltage level which is identical in polarity to the first voltage level, is higher in absolute value than the first voltage level and corresponds to the resistance variable element, the method comprising: changing the resistance value of the series current path within a predetermined range with time in at least one of a case where the resistance variable element switches from the low-resistance state to the high-resistance state and a case where the resistance variable element switches from the high-resistance state to the low-resistance state.

In such a configuration, in the nonvolatile memory device including the memory cell array having plural resistance variable elements which are switchable between plural resistance states in response to electric pulses with the same polarity, it is possible to apply an optimal voltage electric pulse to every individual resistance variable element in view of a difference in characteristic which is generated due to a variation in the resistance variable elements which occurs during a manufacturing process or a difference between the positions of the resistance variable elements on the memory cell array. As a result, reliability of the operation of the nonvolatile memory device can be improved and the life of the device can be extended.

The above and further objects, features and advantages of the present invention will more fully be apparent from the following detailed description of the preferred embodiments with reference to the accompanying drawings.

Effects of the Invention

The present invention has the above described configuration, and achieves the advantages described below. That is, reliability of the operation of the nonvolatile memory device can be improved and the life of the device can be extended, in a nonvolatile memory device including a memory cell array including plural resistance variable elements which are switchable between plural resistance states in response to electric pulses with the same polarity.

Figure 1:
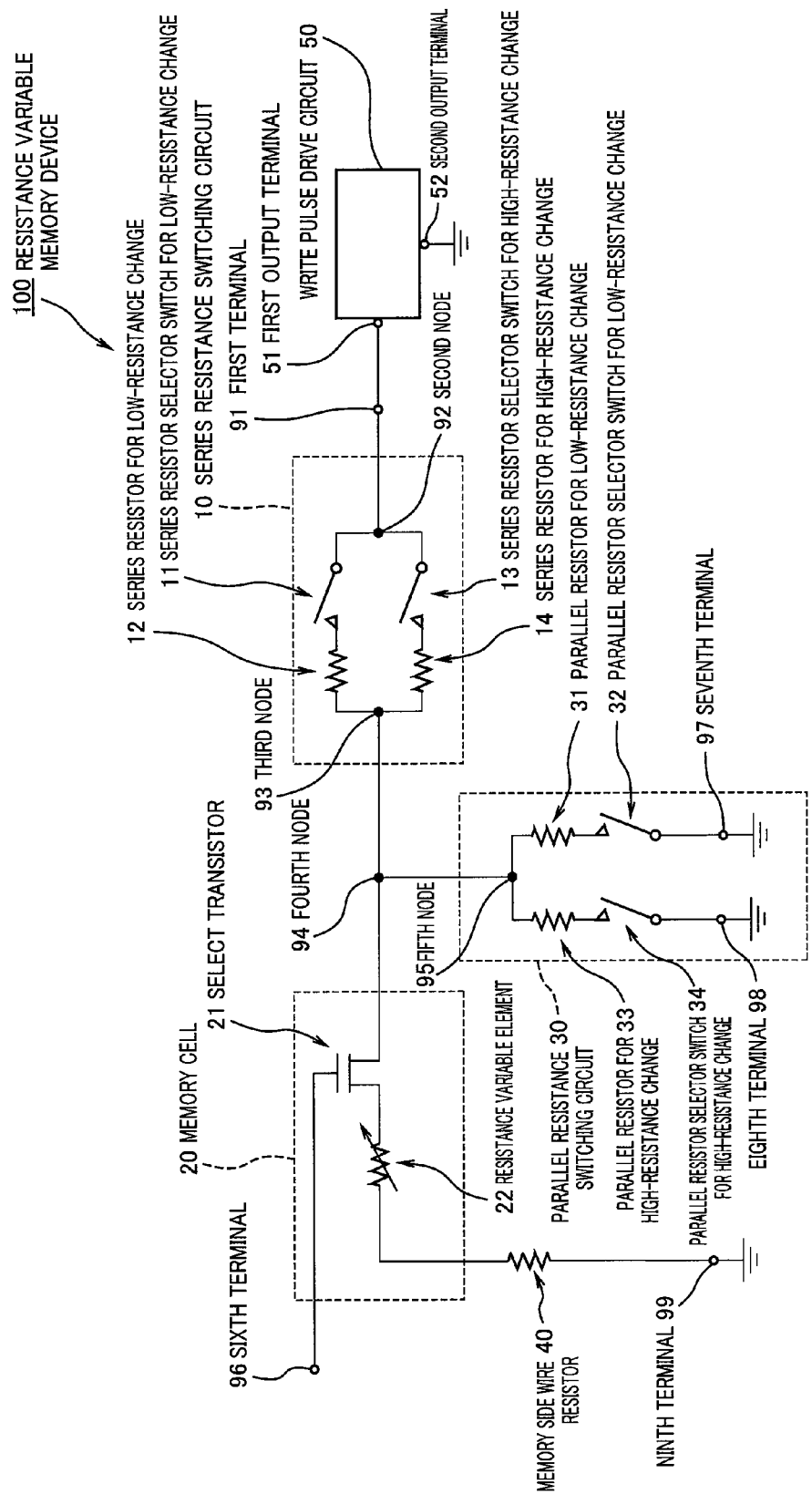
FIG. 1 is a circuit diagram showing an exemplary nonvolatile memory device.

DESCRIPTION OF REFERENCE NUMBERS 1 resistance variable element
2 select transistor
3 source line terminal
4 word line terminal
5 bit line terminal
6 source line
7 word line
8 bit line
9 memory cell
10 series resistance switching circuit
11 series resistor selector switch for low-resistance change
12 series resistor for low-resistance change
13 series resistor selector switch for high-resistance change
14 series resistor for high-resistance change
15 series resistance switching circuit
16 series transistor for low-resistance change
17 series transistor for high-resistance change
20 memory cell
21 select transistor
22 resistance variable element
30 parallel resistance switching circuit
31 parallel resistor for low-resistance change
32 parallel resistor selector switch for low-resistance change
33 parallel resistor for high-resistance change
34 parallel resistor selector switch for high-resistance change
35 parallel resistance switching circuit
36 parallel transistor for low-resistance change
37 parallel transistor for high-resistance change
40 memory side wire resistor
50 write pulse drive circuit
51 first output terminal
52 second output terminal
60 write pulse generating circuit
62 write data decoder
64 host interface circuit
66 row decoder
68 word line driver
69 word line
70 memory cell array
71 bit line
72 read comparator/determiner circuit
73 source line
74 switch controller
75 multi-switch circuit
76 element current detection resistor
77 amplification circuit
78 comparator
79 element state detection circuit
80 controller
81 first terminal
82 second node
83 third node
84 fourth node
85 fifth node
86 sixth terminal
87 seventh terminal
88 eighth terminal
91 first terminal
92 second node
93 third node
94 fourth node
95 fifth node
96 sixth terminal
97 seventh terminal
98 eighth terminal
99 ninth terminal
100 nonvolatile memory device
200 nonvolatile memory device
300 nonvolatile memory device
310 series resistance switching circuit
311 communication bus
312 Rsh ladder resistance group
313 Rsl ladder resistance group
400 nonvolatile memory device

BEST MODE FOR CARRYING OUT THE INVENTION

Hereinafter, principle and embodiments of the present invention will be described with reference to the drawings.

(Principle of the Present Invention)

[Configuration 1]

FIG. 1 is a circuit diagram showing an exemplary nonvolatile memory device. Hereinafter, a basic principle of the nonvolatile memory device of the present invention will be described with reference to FIG. 1.

A shown in FIG. 1, the nonvolatile memory device 100 comprises, as major constituents, a series resistance switching circuit 10 (series resistance setting unit), a memory cell 20, a parallel resistance switching circuit 30 (parallel resistance setting unit), and a write pulse drive circuit 50 (electric pulse application unit).

The series resistance switching circuit 10 includes a circuit for low-resistance change including a series resistor selector switch for low-resistance change 11 and a series resistor for low-resistance change 12, and a circuit for high-resistance change including a resistor selector switch for high-resistance change 13 and a series resistor for high-resistance change 14. These circuits are connected in parallel with each other to a second node 92 and a third node 93 (as used herein, the term "connected" means "electrically connected," and the same applies hereinafter). The second node 92 is connected to a first terminal 91. The third node 93 is connected to a fourth node 94 (reference node). The resistor selector switch for low-resistance change 11 and the series resistor selector switch for high-resistance change 13 are each configured to be turned ON/OFF selectively by a controller (not shown). When the series resistor selector switch for low-resistance change 11 is placed in an ON-state, the series resistor selector switch for high-resistance change 13 is placed in an OFF-state. When the series resistor selector switch for high-resistance change 13 is placed in an ON-state, the series resistor selector switch for low-resistance change 11 is placed in an OFF-state. Note that the second node 92 and the third node 93 are merely exemplarily illustrated as nodes. The two circuits (circuit for low-resistance change and circuit for high-resistance change) may directly branch from the first terminal 91 and from the fourth node 94.

The memory cell 20 includes a select transistor 21 and a resistance variable element 22. One main terminal (source or drain) of the select transistor 21 is connected to the fourth node 94, the other main terminal thereof is connected to one terminal (a first terminal) of the resistance variable element 22, and a gate thereof is connected to a six terminal 96. The other terminal (a second terminal) of the resistance variable element 22 is connected to a ninth terminal 99 via a memory side wire resistor 40. The ninth terminal 99 is electrically grounded (the potential of a ground point is assumed to be 0V and hereinafter the same applies). The select transistor 21 is turned ON/OFF under control of the controller (not shown). In FIG. 1, only one memory cell 20 is shown in FIG. 1 for the sake of description, but a memory cell array including plural memory cells 20 may be formed. Well-known techniques may be employed as a method for selecting a specified memory cell 20 from among those in the memory cell array using the select transistor 21.

The parallel resistance switching circuit 30 includes a circuit for low-resistance change including a parallel resistor for low-resistance change 31 and a parallel resistor selector switch for low-resistance change 32, and a circuit for high-resistance change including a parallel resistor for high-resistance change 33 and a parallel resistor selector switch for high-resistance change 34. These circuits are connected in parallel with each other to a fifth node 95. A seventh terminal 97 and an eighth terminal 98 are respectively provided at the other ends of the circuits and are respectively electrically grounded. The parallel resistor selector switch for low-resistance change 32 and the parallel resistor selector switch for high-resistance change 34 are each configured to be turned ON/OFF selectively by the controller (not shown). When the parallel resistor selector switch for low-resistance change 32 is placed in an ON-state, the parallel resistor selector switch for high-resistance change 34 is placed in an OFF-state. When the parallel resistor selector switch for high-resistance change 34 is placed in an ON-state, the parallel resistor selector switch for low-resistance change 32 is placed in an OFF-state. Note that the fifth node 95 is merely exemplarily illustrated as a node. The two circuits (circuit for low-resistance change and circuit for high-resistance change) may directly branch from the fourth node 94.

The write pulse drive circuit 50 includes a first output terminal 51 and a second output terminal 52. The write pulse drive circuit 50 is configured to apply electric pulses having predetermined voltages and predetermined time widths between the first output terminal 51 and the second output terminal 52 under the control of the controller (not shown). The first output terminal 51 is connected to the first terminal 91 and the second output terminal 52 is electrically grounded.

The select transistor 21 is, for example, a transistor such as MOS-FET. Upon an ON-voltage being applied to the gate of the select transistor 21 via the sixth terminal 96, an electric resistance (to be precise, impedance) between two main terminals decreases, allowing the select transistor 21 to be placed in an electrically-conductive state.

The resistance variable element 22 is a ReRAM element. The ReRAM element has a characteristic in which its resistance value (electric resistance between the first terminal and the second terminal) switches in response to an electric stress applied thereto, and retains the switched resistance value after the electric stress is released. The ReRAM element is adapted to store data in a nonvolatile manner using such a characteristic. The ReRAM element has a structure in which a thin layer material of oxide having a spinel structure such as $CoFe_2O_4$, $CoMn_{3-x}O_4$, $(Co_{1-x}Zn_x)Fe_2O_4$, $(Ni_{1-b}Zn_x)Fe_2O_4$, $NiCr_2O_4$, $Cu_{0.15}Ni_{0.85}Cr_2O_4$, $Mn_3O_4$, $ZnMn_2O_4$, $ZnV_2O_4$, $Fe_3O_4$, $AlV_2O_4$, $ZnCr_2O_4$, $ZnFe_2O_4$, or $ZnGa_2O_4$, oxide having a perovskite structure, or a thin layer material of oxide including Ni or Ti, is sandwiched between specified electrode materials.

The resistance variable element 22 switches between the low-resistance state and the high-resistance state in response to predetermined electric pulses. By allocating the resistance states to data, data is stored. The high-resistance state is allocated to "0" and the low-resistance state is allocated to "1." One feature of the resistance variable element 22 is that writing (writing of "1") and erasing (writing of "0") are performed using the electric pulses with the same polarity. In a case where a positive electric pulse is applied, the resistance variable element 22 in the low-resistance state switches from the low-resistance state to the high-resistance state (attains the high-resistance state) if a positive voltage having an absolute value being equal to or larger than a predetermined value (first value) is applied between the both terminals thereof, while the resistance variable element 22 in the high-resistance state switches from the high-resistance state to the low-resistance state (attains the low-resistance state) if a positive voltage having an absolute value being equal to or larger than other value (second value) which is larger than the first value is applied between the both terminals. In a case where a negative electric pulse is applied, the resistance variable element 22 in the low-resistance state switches from the low-resistance state to the high-resistance state if a negative voltage having an absolute value being equal to or larger than a predetermined value (third value) is applied between the both terminals, while the resistance variable element 22 in the high-resistance state switches from the high-resistance state to the low-resistance state if a negative voltage having an absolute value which is equal to or larger than other value (fourth value) which is larger than the first value is applied between the both terminals. The first value and the third value may be equal to each other in absolute value and the second value and the fourth value may be equal to each other in absolute value.

The series resistor selector switch for low-resistance change 11, the series resistor selector switch for high-resistance change 13, the parallel resistor selector switch for low-resistance change 32 and the parallel resistor selector switch for high-resistance change 34 are drawn as switches in the drawing, for the purpose of explanation, but may be constituted by transistors such as MOS-FETs.

The series resistor for low-resistance change 12, the series resistor for high-resistance change 14, the parallel resistor for low-resistance change 31, the parallel resistor for high-resistance change 33, and the memory side wire resistor 40 are drawn as fixed resistive elements in the drawings for the purpose of explanation. It is needless to say that the fixed resistive elements are illustrated for convenience to collectively show the resistance values on current paths including the switches (including ON-resistances of the transistors), wires and others, and the values of them should be off course considered as an actual value of a total impedance according to a frequency band of the electric pulse for driving, including a capacitive impedance. As the resistors, the fixed resistive elements need not be provided actually, but desired impedances may be set using wire resistance, ON-resistances of the switches, wire capacities, etc (hereinafter the same applies).

Hereinafter, the relationship between the resistance values of the current paths and the voltages which is one feature of the nonvolatile memory device 100 will be described.

The current path connecting the first terminal 91 to the fourth node 94 (reference node) has a series connection relationship with the memory cell 20, supposing that the current path from the first terminal 91 to a ground point (second output terminal 52) is one current path. Accordingly, this current path is referred to as a series current path. The resistance value of the series current path (current path connecting 91, 92, 11, 12, 93, and 94 in turn in FIG. 1) passing through the series resistor for low-resistance change 12 with the series resistor selector switch for low-resistance change 11 being in an ON-state and the series resistor selector switch for high-resistance change 13 being in an OFF-state is expressed as Rsl. The resistance value of the series current path (current path connecting 91, 92, 13, 14, 93, and 94 in turn in FIG. 1) passing through the series resistor for high-resistance change 14 with the series resistor selector switch for high-resistance change 13 being in an ON-state and the series resistor selector switch for low-resistance change 11 being in an OFF-state is expressed as Rsh. Rsl includes the wire resistance, the ON-resistance of the series resistor selector switch for low-resistance change 11, and the like in addition to the resistance of the series resistor for low-resistance change 12. Rsh includes the wire resistance, the ON-resistance of the series resistor selector switch for high-resistance change 13, and the like in addition to the resistance of the series resistor for high-resistance change 14. It is supposed that the resistance between the first output terminal 51 and the first terminal 91 is negligible.

The current path (current path connecting 94, 21, 22, 40, 99 and 52 in turn in FIG. 1) connecting the fourth node 94 (reference node) to the ninth terminal 99 (and second output terminal 52) with the select transistor 21 being in an ON-state is referred to as a resistance switching current path. The resistance value of the resistance switching current path in the state where the resistance variable element 22 is in the low-resistance state is expressed as Rrl and the resistance value of the resistance switching current path in the state where the resistance variable element 22 is in the high-resistance state is expressed as Rrh. Rrl and Rrh each includes the wire resistance, the ON-resistance of the select transistor 21, the resistance of the memory side wire resistor 40, and the like in addition to the resistance of the resistance variable element 22.

The current path connecting the fourth node 94 (reference node) to the ground point (seventh terminal 97 or eighth terminal 98) form a parallel positional relationship with the memory cell 20, supposing that the current path from the first terminal 91 to the ground point (97, 98, 99, 52) is one current path. Accordingly, this current path is referred to as a parallel current path. The resistance value of the parallel current path (current path connecting 94, 95, 31, 32, 97, and 52 in turn in FIG. 1) passing through the parallel resistor for low-resistance change 31 with the parallel resistor selector switch for low-resistance change 32 being in an ON-state and the parallel resistor selector switch for high-resistance change 34 being in an OFF-state is expressed as Rpl. The resistance value of the current path (current path connecting 94, 95, 33, 34, 98 and 52 in turn in FIG. 1) passing through the parallel resistor for high-resistance change 33 with the parallel resistor selector switch for high-resistance change 34 being in an ON-state and the parallel resistor selector switch for low-resistance change 32 being in an OFF-state is expressed as Rph. Rpl includes the wire resistance, the ON-resistance of the parallel resistor selector switch for low-resistance change 32, and the like, in addition to the resistance of the parallel resistor for low-resistance change 31. Rph includes the wire resistance, the ON-resistance of the parallel resistor selector switch for high-resistance change 34, and the like in addition to the resistance of the parallel resistor for high-resistance change 33.

Since the second output terminal 52, the seventh terminal 97, the eighth terminal 98 and the ninth terminal 99 are electrically grounded, they may be assumed to be connected to each other. To be specific, it may be said that the resistance switching current path is a current path connecting the fourth node 94 to the second output terminal 52 via the resistance variable element 22, and the parallel current path is a current path connecting the fourth node 94 to the second output terminal 52 in parallel with the resistance switching current path.

Figure 15:
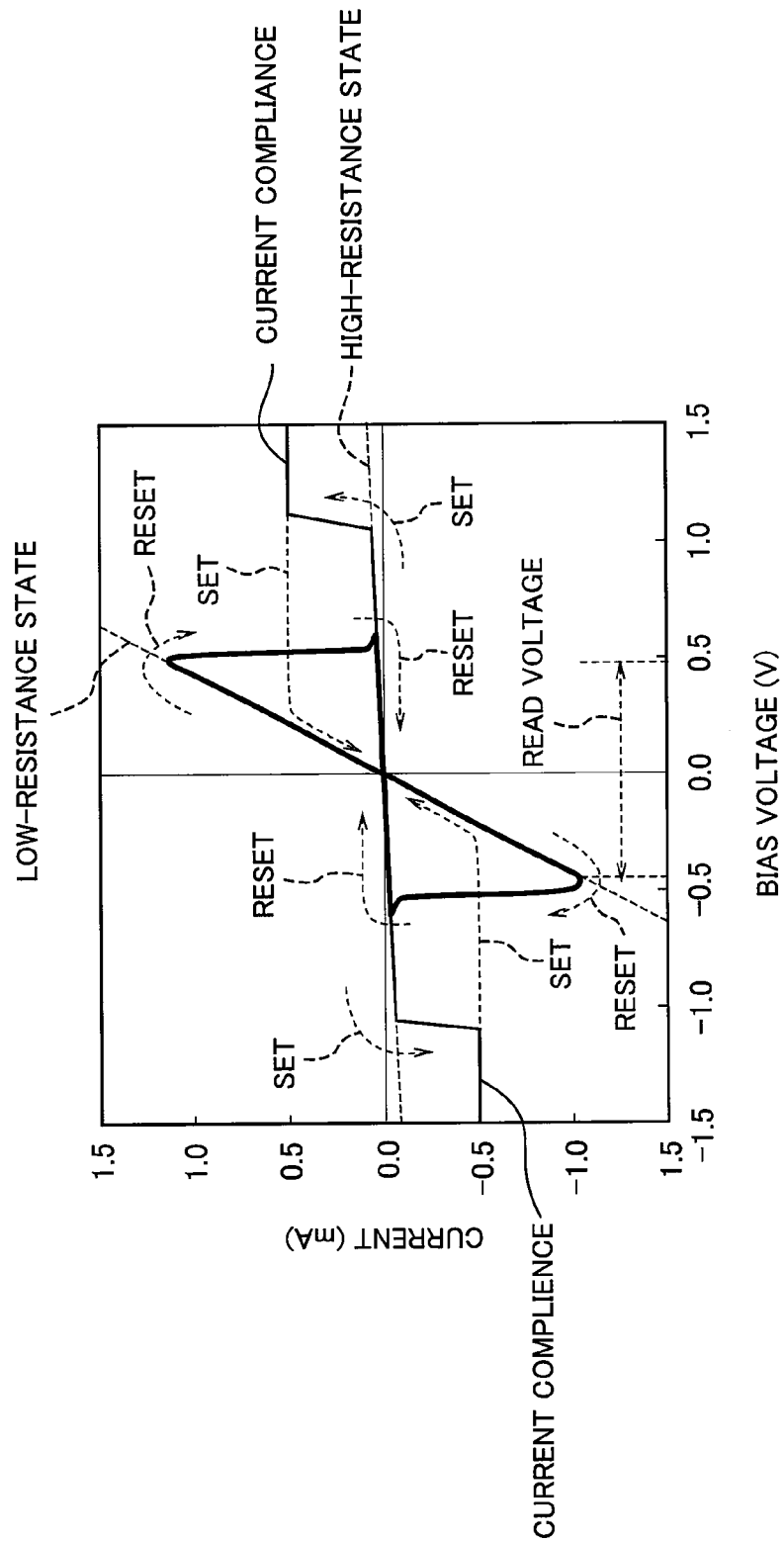
FIG. 15 is a view showing a voltage-current characteristic of a ReRAM element of Non-patent document 1.

The resistance variable element 22 has a current-voltage characteristic which is similar to that shown in FIG. 15, although its specific current value and voltage may be different. The potential (potential difference between the ground potential and the reference node) of the fourth node 94 (reference node) is hereinafter referred to as the node potential. The absolute value of the node potential which is required to switch the resistance variable element 22 from the low-resistance state to the high-resistance state is expressed as Vlh (first voltage level). The absolute value of the node potential which is required to switch the resistance variable element 22 from the high-resistance state to the low-resistance state is expressed as Vhl (second voltage level). The two node potentials have the same polarity (signs are same). The second voltage level is higher than the first voltage level (Vhl>Vlh). Note that the potentials are based on the ground points as a reference (the same applies hereinafter).

The absolute value of the voltage of the electric pulse (first electric pulse) applied by the write pulse drive circuit 50 to switch the resistance variable element 22 from the low-resistance state to the high-resistance state is expressed as V1. To surely enable the element to switch to the high-resistance state, it is necessary that the absolute value of the node potential at the time when the first electric pulse is applied be Vlh or higher. When the condition which should be satisfied by the absolute value of the potential of the reference node and the resistance values is calculated under the above condition, the following formula (1) is derived. Note that Vlh is not always equal to the threshold of the voltage (absolute value) applied to the resistance variable element 22 (between both terminals of the resistance variable element 22). That is, the absolute value of the voltage applied to the resistance variable element 22 may be sometimes smaller than Vlh even when the absolute value of the node potential is Vlh, because the absolute value of the node potential is a voltage which is a sum of a voltage drop generated due to the wire resistance, the ON-resistance of the transistor or the like, and the voltage applied to the both terminals of the resistance variable element 22 to switch the resistance variable element 22 to switch to the high-resistance state.

$$\frac{V1 \times Rpl - Vlh \times Rpl}{Vlh + \frac{Vlh \times Rpl}{Rrl}} \geq Rsl \quad (1)$$

The plural resistance variable elements 22 are arranged on the memory cell array, and therefore, there is a variation in their resistance switching characteristics. In the case where an electric pulse having a specified width is applied to these elements, some of them, which operate at higher speeds, switch the resistances well in a front-half part of the width. In this case, even after the element has switched to the high-resistance state, they are applied with a voltage having an absolute value of V1 from the write pulse drive circuit 50. To prevent the resistance variable element 22 from switching back to the low-resistance state or being broken down, it is necessary to make the absolute value of the node potential smaller than Vhl quickly after the element has switched to the high-resistance state. When the condition which should be satisfied by the absolute value of the potential of the reference node and the resistance values is calculated under the above condition, the following formula (2) is derived:

$$\frac{V1 \times Rpl - Vhl \times Rpl}{Vhl + \frac{Vhl \times Rpl}{Rrh}} < Rsl \quad (2)$$

If the formula (2) is satisfied, rapid increase in the absolute value of the node potential can be prevented, because a current can be released to the parallel current path even when the resistance value of the resistance variable element 22 rises.

The absolute value of the voltage of the electric pulse (second electric pulse) applied from the write pulse drive circuit 50 to switch the resistance variable element 22 from the high-resistance state to the low-resistance state is expressed as V2. To enable the element 22 to surely switch to the low-resistance state, it is necessary that the absolute value of the node potential at the time when the second electric pulse is applied be Vhl or higher. When the condition which should be satisfied by the absolute value of the potential of the reference node and the resistance values is calculated under the above condition, the following formula (3) is derived. Note that Vhl is not always equal to the threshold of the voltage (absolute value) applied to the resistance variable element 22 (between the both terminals of the resistance variable element 22). That is, the absolute value of the voltage applied to the resistance variable element 22 may be sometimes smaller than Vhl even when the absolute value of the node potential is Vhl, because the absolute value of the node potential is a voltage which is a sum of a voltage drop generated due to the wire resistance, the ON-resistance of the transistor or the like, and the voltage applied between the both terminals of the resistance variable element 22 to switch the resistance variable element 22 to the low-resistance state.

$$\frac{V2 \times Rph - Vhl \times Rph}{Vhl + \frac{Vhl \times Rph}{Rrh}} \geq Rsh \quad (3)$$

For the reason similar to that mentioned above, some of the resistance variable elements 22 which operate at the higher speeds, are applied with a voltage having an absolute value of V2 from the write pulse drive circuit 50, even after the element has switched to the low-resistance state, because there is a variation in the resistance switching characteristics of the elements. To prevent the resistance variable element 22 from switching back to the high-resistance state or being broken down, it is necessary to make the absolute value of the node potential smaller than Vlh quickly after the element has transitioned to the low-resistance state. When the condition which should be satisfied by the absolute value of the potential of the reference node and the resistance values is calculated under the above condition, the following formula (4) is derived:

$$\frac{V2 \times Rph - Vlh \times Rph}{Vlh + \frac{Vlh \times Rph}{Rrl}} < Rsh \quad (4)$$

If the formula (4) is satisfied, it is possible to prevent a rapid increase in the current flowing in the resistance variable element 22 (or rapid increase in the absolute value of the node potential relative to the resistance value of the resistance switching current path), because a sufficient potential drop is generated in the series current path even when the resistance value of the resistance variable element 22 is reduced.

In the nonvolatile memory device 100, Rsl, Rsh, Rpl, Rph, Rrl, Rrh, Vlh, Vhl, V1 and V2 are set to satisfy all of the above described conditions. In accordance with such a configuration, in writing of data to the resistance variable element using the electric pulses with the same polarity, it is possible to control the absolute value of the voltage applied to the resistance variable element after its resistance state has switched so that it falls within a proper range. That is, it is possible to design a circuit specifically using a voltage-dividing relationship calculated from the resistance values of the current paths. Therefore, it is possible to surely prevent switching back (returning to its initial resistance state) after the resistance state has switched or break down of the resistance variable element.

By using desired fixed resistive elements, by controlling the ON-resistances of the transistors used as the switches, or by adjusting the material or thickness of the resistance variable elements 22 or the wires, the resistance values of the current paths and the potentials can be easily controlled.

It should be noted that Vhl in the formula (2) and Vlh in the formula (4) are conditions for preventing the break of the resistance variable element 22 or the switching back of the resistance state, and need not necessarily coincide with Vhl and Vlh mentioned above. The voltages may have some allowance and may have smaller absolute values. For example, the circuit may be designed based on the following formula (5) derived from the formula (2) when Vhmax<Vhl:

$$\frac{V1 \times Rpl - Vhmax \times Rpl}{Vhmax + \frac{Vhmax \times Rpl}{Rrh}} < Rsl \quad (5)$$

The circuit may be designed based on the following formula (6) derived from the formula (4) when Vlmax<Vlh.

$$\frac{V2 \times Rph - Vlmax \times Rph}{Vlmax + \frac{Vlmax \times Rph}{Rrl}} < Rsh \quad (6)$$

In such a configuration, it is possible to reduce the absolute value of the potential applied to the resistance variable element after the resistance state has switched to a sufficiently small value, and therefore to more surely prevent the break down of the resistance variable element or the switching back of the resistance state of the resistance variable element.

The operation of the nonvolatile memory device 100 will be described using illustrated specific numeric values. It is needless to say that the numeric values are merely illustrative and may be other values. It is assumed that the capacitive impedance is zero in this example for the simple explanation.

Consider a case where when Rrl is 5 kΩ and Rrh is 50 kΩ, the resistance value of the resistance switching current path changes a single digit. It is assumed that Vlh is 2.0V and Vhl is 3.5V. In such a configuration, to switch the resistance variable element 22 in the low-resistance state to the high-resistance state, it is necessary to flow a current of (2.0[V]÷5 [kΩ]=400 [μA]), while to switch the resistance variable element 22 in the high-resistance state to the low-resistance state, it is necessary to flow a current of (3.5[V]÷50 [kΩ]=70 [μA]).

Receiving an address of a memory cell 20 to which data is to be written and write data from an upstream system, the controller selects the specified memory cell 20 using the column decoder (not shown), the row decoder (not shown), etc. The select transistor 21 of the selected memory cell 20 is placed in an electrically-conductive state. In addition, the controller controls the switches. When the write data is "0," the series resistor selector switch for low-resistance change 11 and the parallel resistor selector switch for low-resistance change 32 are turned ON, and the series resistor selector switch for high-resistance change 13 and the parallel resistor selector switch for high-resistance change 34 are turned OFF, to switch the resistance variable element 22 to the high-resistance state. On the other hand, when the write data is "1," the series resistor selector switch for high-resistance change 13 and the parallel resistor selector switch for high-resistance change 34 are turned ON, and the series resistor selector switch for low-resistance change 11 and the parallel resistor selector switch for low-resistance change 32 are turned OFF, to switch the resistance variable element 22 to the low-resistance state. When the control for the switches is complete, the controller controls the write pulse drive circuit 50 to cause the drive circuit 50 to output a write pulse between the first output terminal 51 and the second output terminal 52.

Firstly, consider a case where the resistance variable element 22 is switched from the low-resistance state to the high-resistance state. When the element 22 is switched to the high-resistance state, the absolute value of the voltage tends to be larger because the resistance value increases after the element has switched to the high-resistance state. In light of such a situation, the formula (5) is used to provide allowance. V1 is set to 5V, and Rpl is set to 2 kΩ as a practicable value in the semiconductor process. Vlmax is set to a value which is one volt smaller than Vlh. When the values are assigned to the formula (1) and the formula (5), the following condition is derived:

$$1923[\Omega] < Rsl \leq 2143[\Omega]$$

For example, Rsl is set to 2100[Ω] so that Vlh is close to 2.0V. In accordance with the above condition, when the write pulse drive circuit 50 applies to the first terminal 91 the electric pulse having an absolute value of 5V in the state where the resistance variable element 22 is in the low-resistance state, the absolute value of the node potential is 2.0V and the resistance variable element 22 switches to the high-resistance state. After the resistance variable element 22 has switched to the high-resistance state, the absolute value of the node potential is 2.4V which is sufficiently smaller than Vhl (3.5V). Therefore, switching back to the low-resistance state will not occur.

Figure 2:
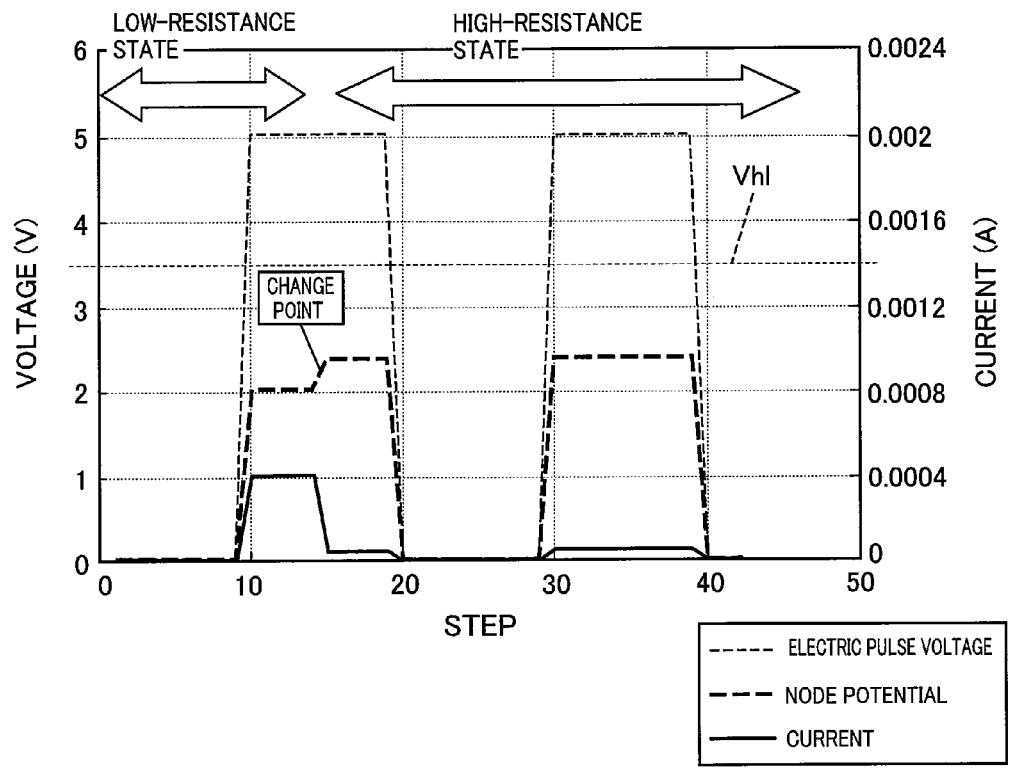
FIG. 2 is a graph schematically showing changes in an electric pulse voltage, a current flowing in a resistance variable element 22, and a node potential in a case where the resistance variable element 22 is switched from a low-resistance state to a high-resistance state in Configuration 1.

FIG. 2 is a graph schematically showing changes in an electric pulse voltage, a current flowing in the resistance variable element 22, and a node potential in a case where the resistance variable element 22 is switched from the low-resistance state to the high-resistance state in Configuration 1. A horizontal axis indicates time, but a time unit varies depending on a response speed of the resistance variable element 22. For this reason, the time is scaled and indicated by step number. For example, one step may be 100 ns or otherwise 10 μs. As shown in FIG. 2, when the write pulse drive circuit 50 applies the electric pulse having an absolute value of 5V in the state where the resistance variable element 22 is in the low-resistance state, the resistance variable element 22 switches to the high-resistance state. After the resistance state has switched to the high-resistance state, the absolute value of the node potential does not increase up to a value which is beyond Vhl. Therefore, switching back to the low-resistance state will not occur.

Subsequently, consider a case where the element 22 is switched from the high-resistance state to the low-resistance state. V2 is set to 5V, and Rph is set to, for example, 30 kΩ as a practicable value in the semiconductor process. When the values are assigned to the formula (3) and the formula (4), the following condition is derived:

$$6429[\Omega] < Rsl \leq 8036[\Omega]$$

For example, Rsh is set to 8000 [Ω] so that Vhl is close to 3.5V. In accordance with the above condition, when the write pulse drive circuit 50 applies to the first terminal 91, the electric pulse having an absolute value of 5V in the state where the resistance variable element 22 is in the high-resistance state, the absolute value of the node potential is 3.5V and the resistance variable element 22 switches to the low-resistance state. After the resistance variable element 22 has switched to the low-resistance state, the absolute value of the node potential is 1.7V which is sufficiently smaller than Vlh (2.0V). Therefore, switching back to the high-resistance state will not occur.

Figure 3:
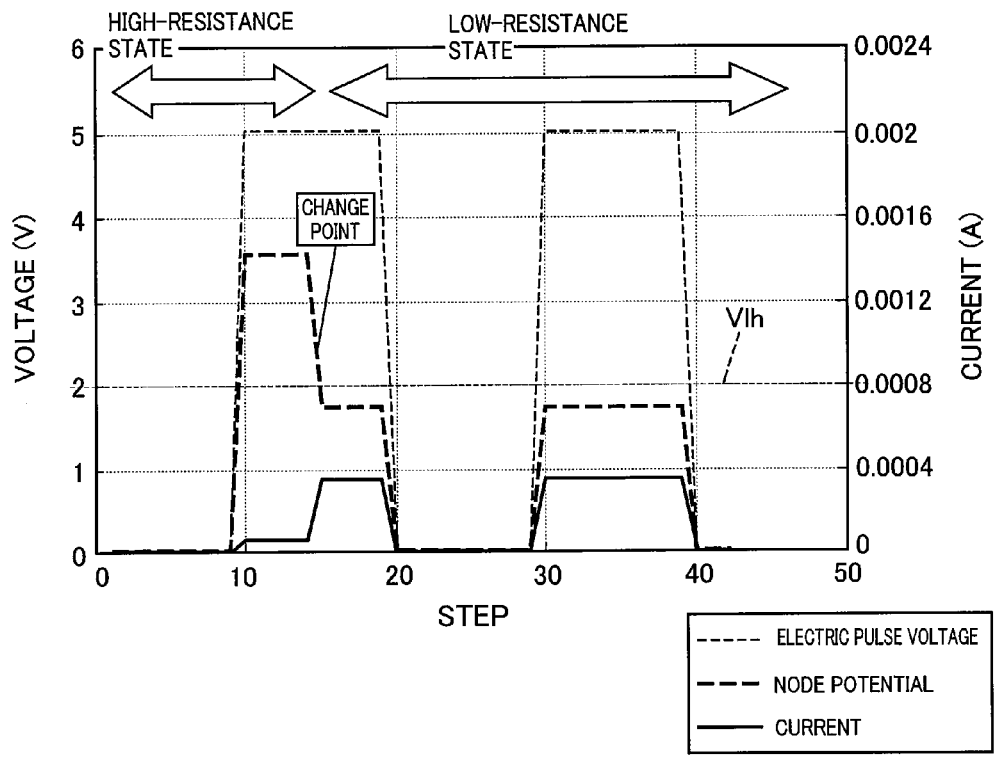
FIG. 3 is a graph schematically showing changes in an electric pulse voltage, a current flowing in the resistance variable element 22, and a node potential in a case where the resistance variable element 22 is switched from the high-resistance state to the low-resistance state in Configuration 1.

FIG. 3 is a graph schematically showing changes in an electric pulse voltage, a current flowing in the resistance variable element 22, and a node potential in a case where the resistance variable element 22 is switched from the high-resistance state to the low-resistance state in Configuration 1. A horizontal axis indicates the step number as in the case of FIG. 2. As shown in FIG. 3, when the write pulse drive circuit 50 applies the electric pulse having an absolute value of 5V in the state where the resistance variable element 22 is in the high-resistance state, the resistance variable element 22 switches to the low-resistance state. After the resistance state has switched to the low-resistance state, the absolute value of the node potential does not increase up to a value which is beyond Vlh. Therefore, switching back to the high-resistance state will not occur.

Also, as shown in FIG. 2, even when the write pulse drive circuit 50 applies the electric pulse having an absolute value of 5V again after the element 22 has switched to the high-resistance state, the absolute value of the node potential does not increase up to a value which is beyond Vhl. Therefore, switching back to the low-resistance state will not occur. Or, as shown in FIG. 3, even when the write pulse drive circuit 50 applies the electric pulse having an absolute value of 5V again after the element 22 has switched to the low-resistance state, the absolute value of the node potential does not increase up to a value which is beyond Vlh. Therefore, switching back to the high-resistance state will not occur. This implies that the nonvolatile memory device 100 has an over-writable configuration without any special design. That is, in the conventional nonvolatile memory device, an operation is needed, in which stored data is read prior to writing, is compared to a value to be written, and no electric pulse is applied to a memory cell which is not required to change the resistance state. In this configuration, since reading in advance is not necessary, a processing speed is improved. Since it is not necessary to reset the element to the low-resistance state once (erase data all at once) in writing of data unlike the conventional configuration, the element is not subjected to an unnecessary electrical stress. As a result, it is possible to provide a highly-reliable nonvolatile memory device.

With the configuration and operation described above, the nonvolatile memory device 100 can achieve a nonvolatile memory device which does not require deleting data all at once when writing of data and has an improved processing speed. In addition, the nonvolatile memory device 100 is capable of surely preventing the incorrect operation or the break down of the element during writing, with a simple configuration, in which the resistance variable element switching between plural resistance states in response to the electric pulses with the same polarity is used.

It should be noted that the above illustrated numeric values are merely illustrative and formulae or specific numeric values to be used may be selected or set as desired. The correspondence between the resistance states and the data (stored values) may be determined as desired. The high-resistance state may correspond to "1," and the low-resistance state may correspond to "0." Alternatively, three or more resistance states may be set to enable the memory to operate as a multi-valued memory.

As the characteristic of the resistance variable element, the characteristic which allows writing to the low-resistance state and to the high-resistance state in response to the electric pulses with the same polarity will suffice. The electric pulses for use in actual writing may have different polarities between switching to the low-resistance state and switching to the high-resistance state.

V1 and V2 are not necessarily equal values but may be different values. Nonetheless, it is desired that V1 and V2 be equal to simplify the device configuration or operation control.

[Configuration 2]

In Configuration 1, the series current path and the parallel current path are each comprised of a fixed resistive element and a switch which are generally used, and the write pulse drive circuit 50 applies pulses. In contrast, in Configuration 2, the resistors and switches of the series current path and the parallel current path are implemented by ON-resistance and switching functions of the transistors, and the electric pulse is generated and input by ON/OFF operation of the transistors.

Figure 4:
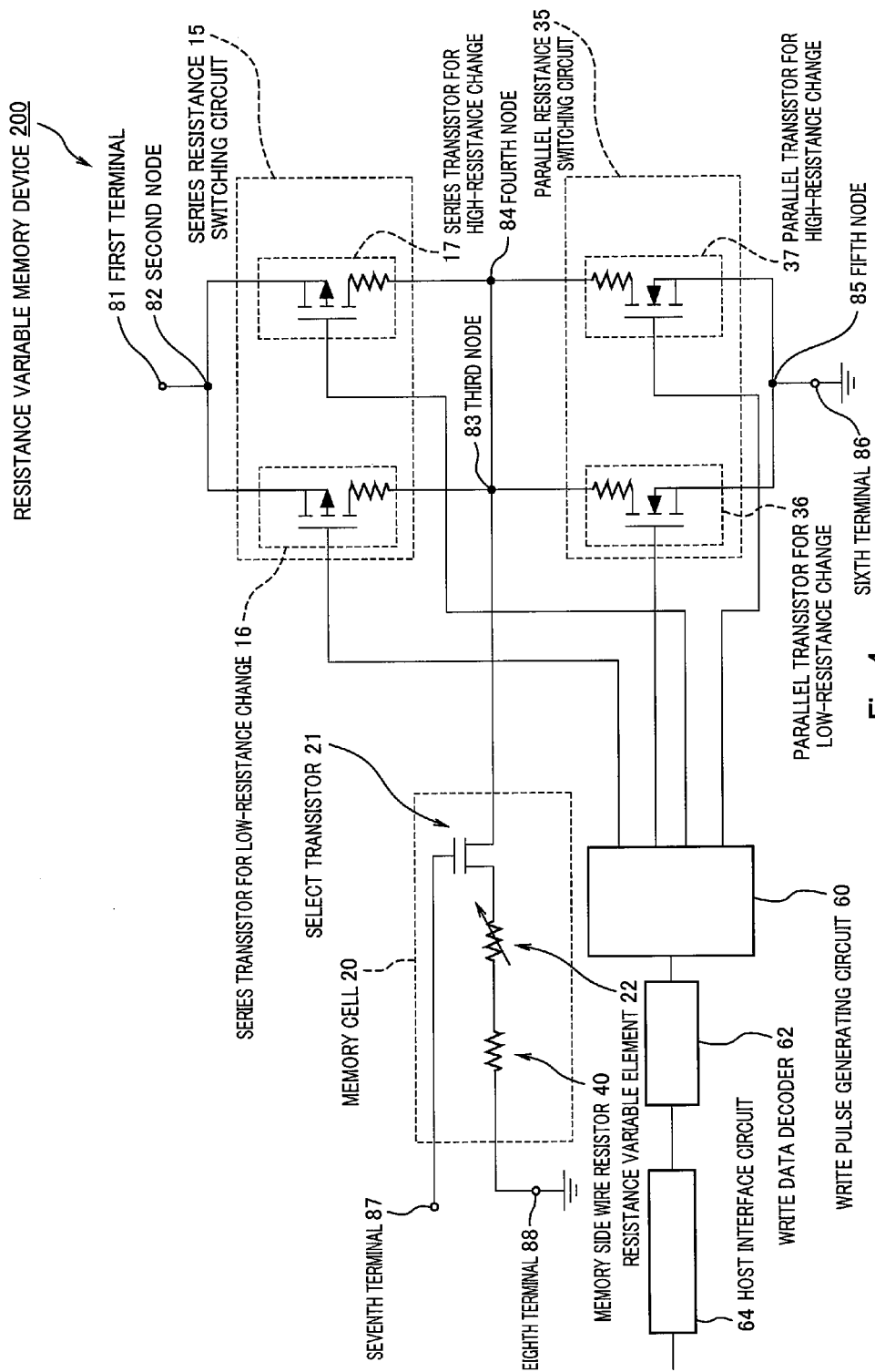
FIG. 4 is a block diagram showing an exemplary nonvolatile memory device according to Configuration 2.

FIG. 4 is a block diagram showing an exemplary nonvolatile memory device according to Configuration 2. Hereinafter, the basic principle of the nonvolatile memory device of the present invention will be described with reference to FIG. 4.

As shown in FIG. 4, a nonvolatile memory device 200 comprises a series resistance switching circuit 15 (series resistance setting unit), the memory cell 20, a parallel resistance switching circuit 35 (parallel resistance setting unit), a write pulse generating circuit 60 (electric pulse application unit), a write data decoder 62, and a host interface circuit 64.

The series resistance switching circuit 15 includes a series transistor for low-resistance change 16 and a series transistor for high-resistance change 17. A circuit for low-resistance change including the series transistor for low-resistance change 16 is connected to the second node 82 and to the third node 83. In parallel with this circuit, a circuit for high-resistance change including the series transistor for high-resistance change 17 is connected to the second node 82 and to the fourth node 84. The second node 82 is connected to the first terminal 81. The third node 83 and the fourth node 84 are interconnected. The series transistor for low-resistance change 16 and the series transistor for high-resistance change 17 are connected to the write pulse generating circuit 60 so that they are turned ON/OFF selectively by the write pulse generating circuit 60. When the series transistor for low-resistance change 16 is in an ON-state, the series transistor for high-resistance change 17 is placed in an OFF-state. When the series transistor for high-resistance change 17 is in an ON-state, the series transistor for low-resistance change 16 is placed in an OFF-state. As the series transistor for low-resistance change 16 and the series transistor for high-resistance change 17, P-type MOS-FETs are used. The second node 82 is merely exemplarily illustrated as the node. Two circuits (circuit for high-resistance change and circuit for low-resistance change) may directly branch from the first terminal 81. The third node 83 and the fourth node 84 may be a single node.

The memory cell 20 is identical to the memory cell 20 in Configuration 1, and will not be described in detail repetitively. One main terminal of the select transistor 21 is connected to the third node 83 and to the fourth node 84. The seventh terminal 87 is identical to the sixth terminal 96 in Configuration 1, and the eighth terminal 88 is identical to the ninth terminal 99 in Configuration 1.

The parallel resistance switching circuit 35 includes a parallel transistor for low-resistance change 36 and a parallel transistor for high-resistance change 37. A circuit for low-resistance change including the parallel transistor for low-resistance change 36 is connected to the third node 83 and to the fifth node 85. In parallel with this circuit, a circuit for high-resistance change including the parallel transistor for high-resistance change 37 is connected to the fourth node 84 and to the fifth node 85. The fifth node 85 is connected to the sixth terminal 86. The sixth terminal 86 is electrically grounded. The parallel transistor for low-resistance change 36 and the parallel transistor for high-resistance change 37 are connected to the write pulse generating circuit 60 so that they are turned ON/OFF selectively by the write pulse generating circuit 60. When the parallel transistor for low-resistance change 36 is in an ON-state, the parallel transistor for high-resistance change 37 is placed in an OFF-state. When the parallel transistor for high-resistance change 37 is in an ON-state, the parallel transistor for low-resistance change 36 is placed in an OFF-state. As the parallel transistor for low-resistance change 36 and the parallel transistor for high-resistance change 37, N-type MOS-FETs are used. The fifth node 85 is merely exemplarily illustrated as the node. Two circuits (circuit for low-resistance change and circuit for high-resistance change) may directly branch from the sixth terminal 86.

The first terminal 81 is connected to the electric power supply (not shown) and is applied with a predetermined voltage (e.g., +5V). The electric power supply has two terminals. One of the terminals is connected to the first terminal 81 and the other is electrically grounded. That is, the other terminal of the electric power supply is connected to the sixth terminal 86 and to the eighth terminal 88. The applied voltage of the electric power supply may be changed suitably.

The write pulse generating circuit 60 is connected to a gate of the series transistor for low-resistance change 16, a gate of the series transistor for high-resistance change 17, a gate of the parallel transistor for low-resistance change 36, and a gate of the parallel transistor for high-resistance change 37. The write pulse generating circuit 60 is a control circuit configured to control a voltage applied to the gate of each transistor to control ON/OFF of the transistor based on write data input.

The write data decoder 62 is a decoder for decoding a signal input to obtain the address of the memory cell 20 to which data is to be written and the write data. The address is input to the row decoder (not shown) and to the column decoder (not shown). The write data is input to the write pulse generating circuit 60.

The host interface circuit 64 is an interface for inputting a signal to the write data decoder 62 based on input/output data and a control command which are input from an external system via an external interface (not shown).

Hereinafter, the relationship between the resistance values of the current paths and the voltages which is a feature of the nonvolatile memory device 200 will be described. For the sake of simple explanation, it is assumed that the resistance between the third node 83 and the fourth node 84 is negligible and both nodes are at equipotential. The third node 83 and the fourth node 84 serve as references nodes.

The current path connecting the first terminal 81 to the third node 83 (reference node) or the fourth node 84 (reference node) has a series positional relationship with the memory cell 20, supposing that the current path from the first terminal 81 to the eighth terminal 88 is one current path. Accordingly, this current path is referred to as a series current path. The resistance value of the series current path (current path connecting 81, 82, 16, and 83 in turn in FIG. 4) passing through the series transistor for low-resistance change 16 with the series transistor for low-resistance change 16 being in an ON-state is expressed as Rsl. The resistance value of the series current path (current path connecting 81, 82, 17, and 84 in turn in FIG. 4) passing through the series transistor for high-resistance change 17 with the series transistor for high-resistance change 17 being in an ON-state is expressed as Rsh. Rsl includes the wire resistance or the like in addition to the ON-resistance of the series transistor for low-resistance change 16. Rsh includes the wire resistance or the like, in addition to the ON-resistance of the series transistor for high-resistance change 17. Rsl and Rsh can be easily set to desired values by controlling the gate width and gate length of each transistor or dimension and material of the wires, etc.

The current path (current path connecting 84, 83, 21, 22, 40, and 88 in turn in FIG. 4) connecting the third node 83 (reference node) or the fourth node 84 (reference node) to the eighth terminal 88 with the select transistor 21 being in an ON-state is referred to as a resistance switching current path. The resistance value of the resistance variable element 22 in the low-resistance state is expressed as Rrl and the resistance value of the resistance variable element 22 in the high-resistance state is expressed as Rrh. Rrl and Rrh each includes the wire resistance, the ON-resistance of the select transistor 21, the resistance of the memory side wire resistor 40, and the like, in addition to the resistance value of the resistance variable element 22.

The current path connecting the third node 83 (reference node) or the fourth node 84 (reference node) to the ground point (sixth terminal 96) has a parallel positional relationship with the memory cell 20, supposing that the current path from the first terminal 81 to the ground point is one current path. Accordingly, this current path is referred to as a parallel current path. The resistance value of the parallel current path (current path connecting 83, 36, 85, and 86 in turn in FIG. 4) passing through the parallel transistor for low-resistance change 36 with the parallel transistor for low-resistance change 36 being in an ON-state is expressed as Rpl. The resistance value of the current path (current path connecting 84, 37, 85, and 86 in turn in FIG. 4) passing through the parallel transistor for high-resistance change 37 with the parallel transistor for high-resistance change 37 being in an ON-state is expressed as Rph. Rpl includes the wire resistance or the like in addition to the ON-resistance of the parallel transistor for low-resistance change 36. Rph includes the wire resistance or the like, in addition to the ON-resistance of the parallel transistor for high-resistance change 37. Rpl and Rph can be easily set to desired values by controlling the gate width and gate length of each transistor, dimension and material of the wires, etc.

Since one terminal of the electric power supply, the sixth terminal 86, and the eighth terminal 88 are electrically grounded, they may be assumed to be connected to each other. To be specific, it may be considered that the resistance switching current path is a current path connecting the reference node to the electric power supply via the resistance variable element 22, while the parallel current path is a current path connecting the reference node to electric power supply in parallel with the resistance switching current path.

The resistance variable element 22 has a current-voltage characteristic which is similar to that shown in FIG. 15, although its specific current values and voltages may be different. The potential of the third node 83 (reference node) and the potential of the fourth node 94 (reference node) are hereinafter referred to as the node potential. The absolute value of the node potential which is required to switch the resistance variable element 22 from the low-resistance state to the high-resistance state is expressed as Vlh (first voltage level). The absolute value of the node potential which is required to switch the resistance variable element 22 from the high-resistance state to the low-resistance state is expressed as Vhl (second voltage level). The two node potentials have the same polarity (signs are same). In this embodiment, the second voltage level is higher than the first voltage level (Vhl>Vlh).

In the above configuration, the resistance values of the current paths and the voltages are set to satisfy the formula (1) to the formula (4) as described in Configuration 1. In accordance with such a configuration, in writing of data to the resistance variable element using the electric pulses with the same polarity, the absolute value of the voltage applied to the resistance variable element after the resistance state has switched can be controlled to fall within a proper range. Therefore, it is possible to prevent switching back (returning to its initial resistance state) after the resistance state has switched or break down of the resistance variable element.

Alternatively, the resistance values of the current paths and the voltages may be set to satisfy the formula (5) or the formula (6). In such a configuration, the absolute value of the potential applied to the resistance variable element 22 after the resistance state has switched can be reduced to a smaller value. Therefore, it is possible to more surely prevent break down of the resistance variable element or switching back of the resistance state of the resistance variable element.

Hereinafter, the operation of the nonvolatile memory device 200 will be described.

An external system inputs input/output data and a control command to the host interface circuit 64 via an external communication path. Based on the data and the command received, the host interface circuit 64 inputs a signal to the write data decoder 62.

The write data decoder 62 decodes the received signal to specify an address of the memory cell 20 to which data is to be written and write data. The write data decoder 62 controls the column decoder (not shown) and the row decoder (not shown) based on the specified address to select the specified memory cell 20. At this time, the select transistor 21 of the memory cell 20 is placed in an electrically-conductive state.

The write data decoder 62 inputs the decoded write data to the write pulse generating circuit 60. The write pulse generating circuit 60 causes the series transistor for low-resistance change 16 and the series transistor for high-resistance change 17 to be in an ON-state for a specified time to apply a predetermined electric pulse to the memory cell 20 and to the parallel resistance switching circuit 35. In addition, the write pulse generating circuit 60 controls the ON/OFF of the respective transistors to switch the resistance of the series resistance switching circuit 15 and the resistance of the parallel resistance switching circuit 35.

To be specific, the write pulse generating circuit 60 operates as follows. When the write data is "0," the resistance variable element 22 is switched to the high-resistance state. The write pulse generating circuit 60 applies to the gate of the series transistor for low-resistance change 16 a high-resistance state attaining pulse for the series transistor 16 which allows application of a predetermined voltage amplitude between the second node 82 and the gate so that the series transistor 16 is well in an electrically-conductive state for a specified time width. Meanwhile, the write pulse generating circuit 60 applies to the parallel transistor for low-resistance change 36 a high-resistance state attaining pulse for the parallel transistor 36 which allows application of a predetermined voltage amplitude between the fifth node 85 and the gate so that the parallel transistor 36 is well in an electrically-conductive state for a specified time width. At the same time, the write pulse generating circuit 60 applies to the gate of series transistor for high-resistance change 17 and to the gate of the parallel transistor for high-resistance change 37, the potential for allowing the series transistor for high-resistance change 17 and the parallel transistor for high-resistance change 37 to be placed into electrically-non-conductive state. With such an operation, the voltage (absolute value is V1) supplied from the electric power supply is applied between the first terminal 81 and the eighth terminal 88 and between the first terminal 81 and the sixth terminal 86 for the specified time width. Therefore, as described in Configuration 1, the resistance variable element 22 switches from the low-resistance state to the high-resistance state. The resistance variable element 22 in the high-resistance state keeps the high-resistance state.

When the write data is "1," the resistance variable element 22 is switched to the low-resistance state. The write pulse generating circuit 60 applies to the gate of the series transistor for high-resistance change 17 a low-resistance state attaining pulse for the series transistor 17 which allows application of a predetermined voltage amplitude between the second node 82 and the gate so that the series transistor 17 is well in an electrically-conductive state for a specified time width. Meanwhile, the write pulse generating circuit 60 applies to the parallel transistor for high-resistance change 37 a low-resistance state attaining pulse for the parallel transistor 37 which allows application of a predetermined voltage amplitude between the fifth node 85 and the gate so that the parallel transistor 37 is well in an electrically-conductive state for a specified time width. Simultaneously, the write pulse generating circuit 60 applies to the gate of the series transistor for low-resistance change 16 and the gate of the parallel transistor for low-resistance change 36, the potential for allowing the series transistor for low-resistance change 16 and the parallel transistor for low-resistance change 36 to be placed into electrically-non-conductive state. With such an operation, the voltage (absolute value is V2) supplied from the electric power supply is applied between the first terminal 81 and the eighth terminal 88 and between the first terminal 81 and the sixth terminal 86 for the specified time width. Therefore, as described in Configuration 1, the resistance variable element 22 is switched from the high-resistance state to the low-resistance state. The resistance variable element 22 in the low-resistance state keeps the low-resistance state.

The change patterns of the voltages or currents during the operation in Configuration 2 are identical to those in Configuration 1, and will not be described repetitively. Specific numeric values of each of the resistance values and voltages in Configuration 2 may be identical to those in Configuration 1, and will not be described repetitively.

With the above described configuration and operation, the nonvolatile memory device 200 according to Configuration 2 achieves the advantages similar to those achieved by Configuration 1.

In addition, in Configuration 2, the resistance values of the series current path and the parallel current path can be easily set to desired values by controlling the gate widths and gate lengths of the transistors. Therefore, the nonvolatile memory device 200 has an advantage that the resistance values of the current paths can be easily controlled by using an integration technique using a semiconductor process.

[Problem Associated with Configuration 1 and Configuration 2 and Principle of the Present Invention]

As should be appreciated from the above, Configuration 1 and Configuration 2 have been described as essentially including a single resistance variable element. One of the two resistance values of each of the series resistance switching circuit 10 and the parallel resistance switching circuit 30 is selectively used based on the case where the resistance variable element is switched from the low-resistance state to the high-resistance state or the case where the resistance variable element is switched from the high-resistance state to the low-resistance state. However, when plural resistance variable elements are arranged in array to form the memory cell array, a variation resulting from the manufacturing process or the like occurs in the characteristics of the resistance variable elements. In many cases, a wire resistance and a parasitic resistance of the select transistor is not negligible. The voltage of the electric pulse actually applied to the resistance variable element is sometimes different due to a difference between positions of the resistance variable elements on the memory cell array, even when the electric pulse output from the electric pulse application circuit has the same voltage. Because of this, variations in Vlh or Vhl between the respective resistance variable elements occur.

When the node potential is equal for all of the resistance variable elements in writing, a problem (write failure) would sometimes arise in which a voltage high enough to switch the resistance value of a certain resistance variable element is insufficient to switch the resistance value of other resistance variable element. There may possibly be a method of determining the voltage of the electric pulse output from the electric pulse application circuit on the basis of the resistance variable element which is highest in Vlh or Vhl. However, in this method, an excessively high voltage is applied to the resistance variable element which is much smaller in Vlh and Vhl than other resistance variable elements, which lead to situations where the element is broken down or the switched resistance value switches back to an initial value. If the resistance value does not switch in response to the electric pulse applied (write failure), the element is broken down, or the resistance value switches back to its initial value, stability or reliability of the operation of the nonvolatile memory device significantly degrades. Such a problem can be solved to some extent by devising a circuit layout, or by providing plural driver circuits and dividing the array into small regions to reduce a control area of which each driver circuit is in charge. However, the variations cannot be eliminated.

The present invention is directed to solving the above mentioned problems, and an object of the present invention is to improve reliability of an operation of a nonvolatile memory device and extend a life of the device. To be specific, for example, the memory cell array is configured to have plural resistance variable elements in Configuration 1 or Configuration 2, and the resistance value of the series current path is changed within a predetermined range according to a value of data to be written in at least one of the case where a resistance variable element selected from those in the memory cell array is switched from the low-resistance state to the high-resistance state or a case where the selected resistance variable element is switched from the high-resistance state to the low-resistance state. To implement such an operation, the series resistance setting unit is configured to change the resistance value within a predetermined range (range of a variation in Vhl or Vlh).

Embodiment 1

Configuration

Figure 5:
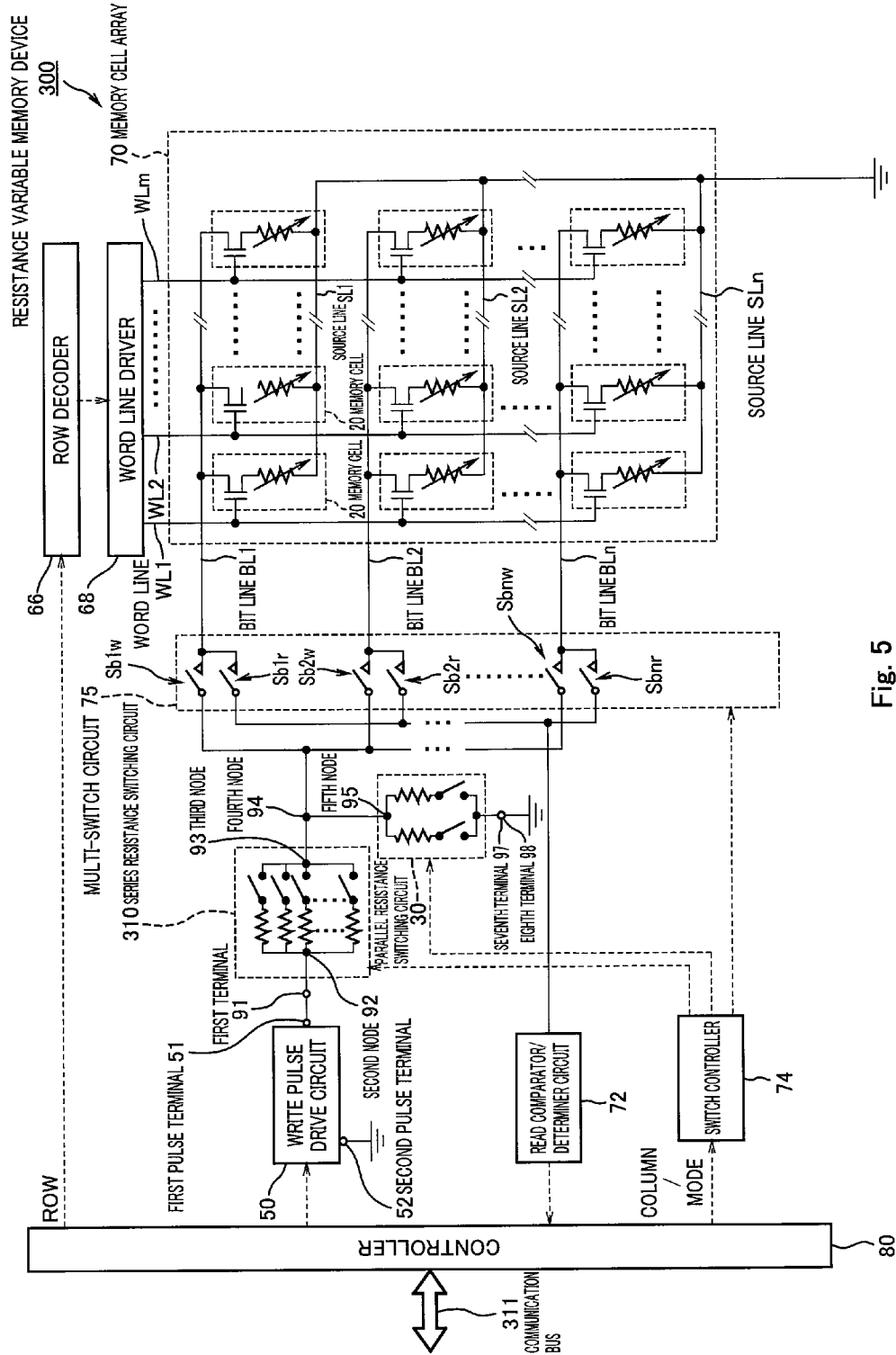
FIG. 5 is a block diagram showing an exemplary nonvolatile memory device according to Embodiment 1 of the present invention.

FIG. 5 is a block diagram showing an exemplary nonvolatile memory device according to Embodiment 1 of the present invention. With reference to FIG. 5, a nonvolatile memory device 300 of this embodiment will be described. The constituents which are identical to those of Configuration 1 (FIG. 1) and Configuration 2 (FIG. 5) are identified by the same reference numbers and names and will not be described repetitively.

As shown in FIG. 5, the nonvolatile memory device 300 comprises as major constituents, a memory cell array 70, a row decoder 66, a word line driver 68 (second select circuit), a multi-switch circuit 75 (first select circuit), a series resistance switching circuit 310, a parallel resistance switching circuit 30, a write pulse drive circuit 50, a read comparator/determiner circuit 72, a switch controller 74, a controller 80, and a communication bus 311.

The memory cell array 70 includes plural memory cells 20. In the memory cell array 70, the memory cells 20 are arranged in matrix form consisting of m rows and n columns. The gates of the select transistors 21 included in the memory cells 20 belonging to respective rows are respectively connected to word lines WL1, WL2, . . . , WLm provided on respective rows. One main terminals of the select transistors 21 of the memory cells 20 belonging to respective columns are respectively connected to n bit lines BL1, BL2, . . . , BLn provided on respective columns. The other main terminals of the select transistors 21 of the memory cells 20 belonging to respective columns are respectively connected to source lines SL1, SL2, . . . , SLn provided on respective columns via the resistance variable elements 22. The source lines SL1, SL2, . . . , SLn are electrically grounded.

The word lines WL1, WL2, . . . , WLm are connected to the word line driver 68. The word line driver 68 is communicatively connected to the row decoder 66 and applies an ON-voltage to a specified word line (selected word line) based on the control of the row decoder 66. Upon application of the ON-voltage to the selected word line, all of the transistors connected to the selected word line are turned ON, and the memory cells on the associated row are rendered accessible. The row decoder 66 is communicatively connected to the controller 80. The row decoder 66 controls the word line driver 68 based on ROW signal received from the controller 80.

The bit lines BL1, BL2, . . . , BLn are respectively connected to the multi-switch circuit 75. The multi-switch circuit 75 is communicatively connected to the switch controller 74 (column decoder). The multi-switch circuit 75 includes plural switches Sb1w, Wb2w, . . . , Sbnw and switches Sb1r, Sb2r, . . . , Sbnr (e.g., FETs) and selectively connects a specified bit line (selected bit line) to the fourth node 94 (reference node) via associated one of the switches Sb1w, Wb2wm, . . . , Sbnw or to the read comparator/determiner circuit 72 via the associated one of switches Sb1r, Sb2r, . . . , Sbnr in accordance with the control of the switch controller 74. The read comparator/determiner circuit 72 is communicatively connected to the controller 80. In the state where the selected bit line is connected to the fourth node 94, the potential of the selected bit line is equal to the node potential. The resistance variable element in the memory cell corresponding to both the selected bit line and the selected word line is a selected resistance variable element.

The fourth node 94 is connected to the write pulse drive circuit 50 via the series resistance switching circuit 310 and electrically grounded (seventh terminal 97, eighth terminal 98) via the parallel resistance switching circuit 30. The write pulse drive circuit 50 is communicatively connected to the controller 80.

The switch controller 74 is communicatively connected to the series resistance switching circuit 310, the parallel resistance switching circuit 30, the multi-switch circuit 75, and the controller 80. The switch controller 74 controls the ON/OFF of the switches of the series resistance switching circuit 310, the parallel resistance switching circuit 30, and the multi-switch circuit 75, based on the signal received from the controller 80.

The read comparator/determiner circuit 72 applies a predetermined read voltage pulse to the selected memory cell, detects the resulting current flowing therethrough, read data stored in the memory cell, and outputs the data to the controller 80.

The communication bus 311 is a communication bus via which communication with outside is enabled. Via the communication bus 311, electric power is supplied, an operation command, write data and read data are input/output to/from the nonvolatile memory device 300.

The controller 80 is constituted by, for example, a microcomputer. The controller 80 receives a control command, address data, and write data via the communication bus 311 from an external system (not shown) and outputs the data read from the memory cell to the external system. When writing and reading data, the controller 80 decodes the address data, controls the multi switch circuit 75 and the row decoder 66 and selects a specified resistance variable element from those in the memory cells.

The series resistance switching circuit 310 includes plural resistive elements which are arranged in parallel with each other and independently connect the second node 92 to the third node 93. The series resistance switching circuit 310 selectively turns ON the resistive element in accordance with the control of the switch controller 74 to change the resistance value of the series current path within a predetermined range in step form. The detailed configuration of the series resistance switching circuit 310 will be described hereinafter.

[Variation in Vlh and Vhl and Resistance Value of Series Current Path]

As described above, in the memory cell array including the resistance variable elements, there are variations in Vlh (high-resistance state attaining pulse) and Vhl (low-resistance state attaining pulse) between the respective resistance variable elements depending on the variation in manufacture and the positions of the resistance variable elements on the memory cell array.

Figure 6:
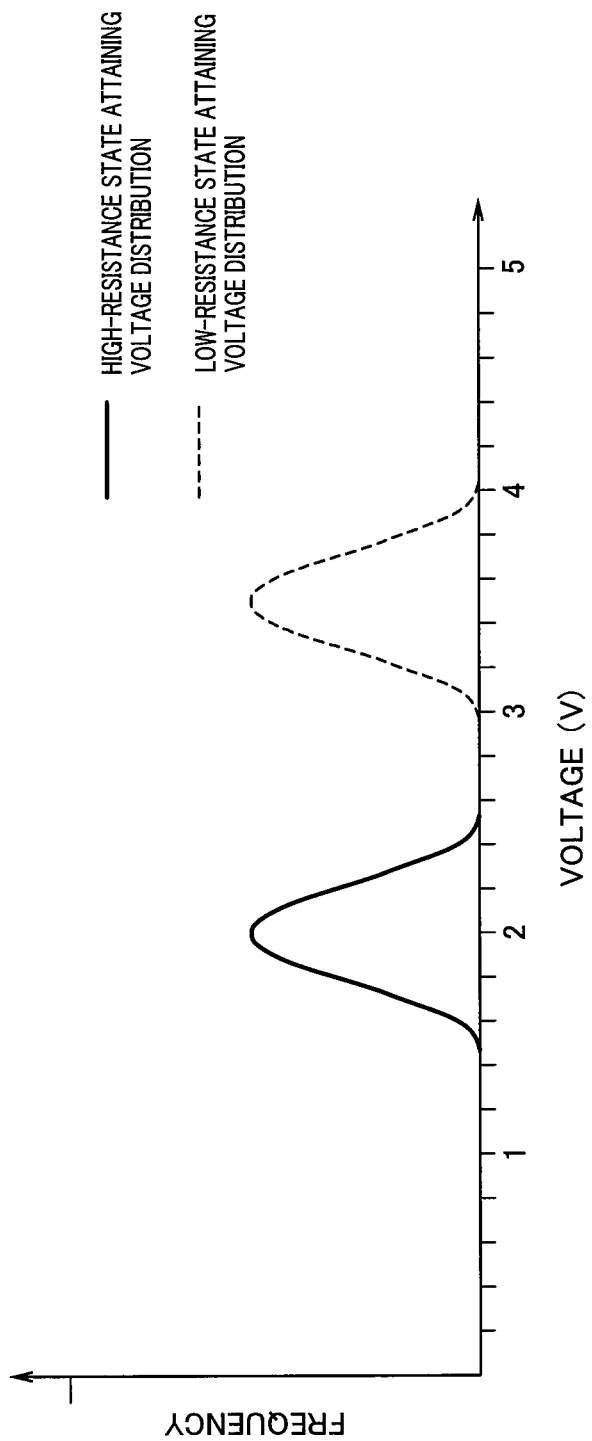
FIG. 6 is a conceptual diagram showing a distribution of a high-resistance state attaining voltage and a distribution of a low-resistance state attaining voltage of respective resistance variable elements in a memory cell array.

FIG. 6 is a conceptual diagram showing a distribution of the high-resistance state attaining voltage and a distribution the low-resistance state attaining voltage of the resistance variable elements in the memory cell array. In FIG. 6, a solid line indicates the distribution of the high-resistance state attaining voltage (Vlh), in which the voltage concentrates in 2.0V and ranges from 1.5V to 2.5V. A dotted line indicates the distribution of the low-resistance state attaining voltage (Vhl), in which the voltage concentrates in 3.5V and ranges from 3.0V to 4.0V.

In the memory cell array having the distribution of FIG. 6, an upper limit voltage of the distribution may be applied to every individual resistance variable element to enable all of the resistance variable elements to surely switch the resistance values. To be specific, a method of controlling the resistance value of the series current path so that the node potential becomes 2.5V when the resistance variable element switches to the high-resistance state and the node potential becomes 4.0V when the resistance variable element switches to the low-resistance state, may possibly be used. However, if an unnecessarily high voltage is applied to the resistance variable element, an excess electrical stress is applied to the element, leading to a short life of the resistance variable element.

In other method, a most frequent value of a voltage or a voltage near the center of the distribution may possibly be applied to the resistance variable element. However, in this case, some elements will not switch the resistance values even though the electric pulses are applied to them, thereby reducing reliability of the operation. Although the elements which cause write failure may be excluded, a memory capacity is reduced in that case.

Figure 7:
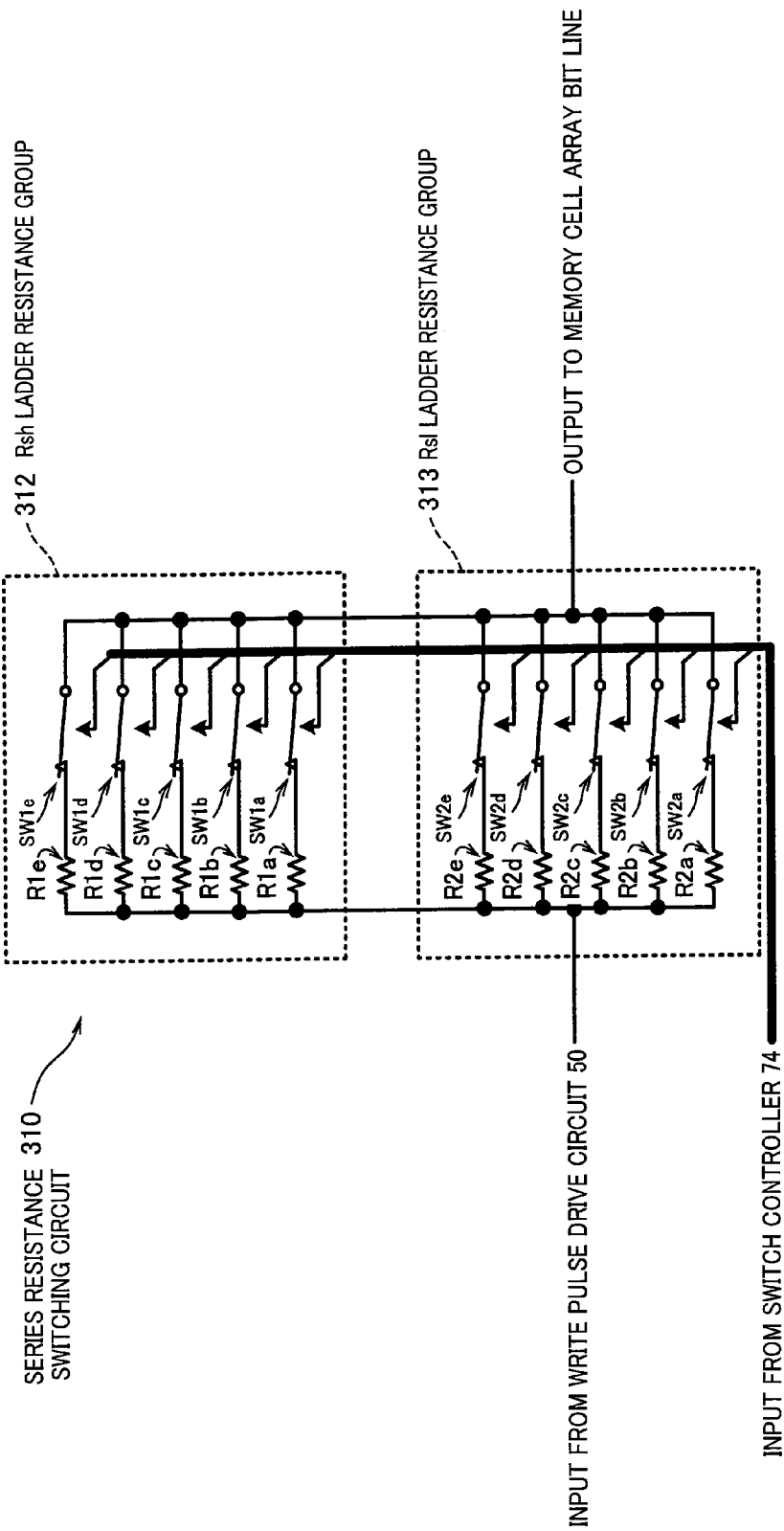
FIG. 7 is a conceptual diagram showing a circuit configuration of a series resistance switching circuit in Embodiment 1 of the present invention.

With a view to solving the above described problem, in this Embodiment, the series resistance switching circuit 310 changes the resistance value of the series current path in a step form within a predetermined range. FIG. 7 is a conceptual diagram showing a circuit configuration of the series resistance switching circuit in Embodiment 1 of the present invention. As shown in FIG. 7, the series resistance switching circuit 310 includes an Rsh ladder resistance group 312 and a Rsl ladder resistance group 313.

The Rsh ladder resistance group 312 includes a first resistance path including a resistive element R1$a$ having a resistance value of Rsha and a switch SW1$a$ connected in series with the resistive element R1$a$, a second resistance path including a resistive element R1$b$ having a resistance value of Rshb and a switch SW1$b$ connected in series with the resistive element R1$b$, a third resistance path including a resistive element R1$c$ having a resistance value of Rshc and a switch SW1$c$ connected in series with the resistive element R1$c$, a fourth resistance path including a resistive element R1$d$ having a resistance value of Rshd and a switch SW1$d$ connected in series with the resistive element R1$d$, and a fifth resistance path including a resistive element R1$e$ having a resistance value of Rshe and a switch SW1$e$ connected in series with the resistive element R1$e$.

The Rsl ladder resistance group 313 includes a sixth resistance path including a resistive element R2$a$ having a resistance value of Rsla and a switch SW2$a$ connected in series with the resistive element R2$a$, a seventh resistance path including a resistive element R2$b$ having a resistance value of Rslb and a switch SW2$b$ connected in series with the resistive element R2$b$, an eighth resistance path including a resistive element R2$c$ having a resistance value of Rslc and a switch SW2$c$ connected in series with the resistive element R2$c$, a ninth resistance path including a resistive element R2$d$ having a resistance value of Rsld and a switch SW2$d$ connected in series with the resistive element R2$d$, and a tenth resistance path including a resistive element R2$e$ having a resistance value of Rsle and a switch SW2$e$ connected in series with the resistive element R2$e$.

The switches SW1$a$~SW1$e$ and the switches SW2$a$~SW2$e$ are respectively communicatively connected to the switch controller 74 and are independently ON/Off controlled. The series resistance switching circuit 310 switches a combination of any one of the switches SW1$a$~SW1$e$ and any one of the switches SW2$a$ SW2$e$ which are to be turned ON in accordance with the control of the controller 80 and the switch controller 74. Thus, the series resistance switching circuit 310 implements Rsh and Rsl illustrated in Configuration 1 by changing the resistance value of the series current path within a predetermined range with time.

Having described above that the series resistance switching circuit is composed of the fixed resistive elements and the switch elements, for example, an ON-resistance of FET may be used in place of the fixed resistive element. In this case, the fixed resistive element and the switch element are constituted by a single FET. In this case, the FET serves as the resistive element as well as the switch. The ON-resistance of the FET corresponds to the resistance value of the fixed resistive element. Since the ON-resistance of the FET can be easily adjusted based on a gate width and a gate length, it is highly compatible with the semiconductor process and is highly practical.

In this Embodiment, Rsha~Rshe satisfy the following formula:

$$Rsha=(Rshb/2)\times\alpha=(Rshc/4)\times\alpha=(Rshd/8)\times\alpha=(Rshe/16)\times\alpha$$

In this Embodiment, Rsla Rsle satisfy the following formula:

$$Rsla=(Rslb/2)\times\beta=(Rslc/4)\times\beta=(Rsld/8)\times\beta=(Rsle/16)\times\beta$$

Hereinafter, a specific design method will be explained. Consider a case where the resistance value of the resistance switching current path changes a single digit when the average value of the resistance value Rrh (resistance value of the resistance switching current path) in the state where the resistance variable element 22 is in the high-resistance state is 50 kΩ and the average value of the resistance value Rrl (resistance value of the resistance switching current path) in the state where the resistance variable element 22 is in the low-resistance state is 5 kΩ. It is supposed that V1=V2=6V considering a variation in the resistance variable elements.

Firstly, consider a case where the resistance variable element 22 switches to the high-resistance state. Once the resistance variable element 22 has switched to the high-resistance state, it is necessary to prevent the resistance variable element 22 from switching back to the low-resistance state. If the voltage to be applied is beyond a lower limit value (3.0V) of a variation distribution of the low-resistance state attaining voltage Vhl, some resistance variable elements would switch back to the low-resistance state. Therefore, it is necessary to set the node potential lower than 3.0V. Therefore, Vhmax=3.0V. When Rpl=2000Ω, the following condition is derived based on the formula (5):

$$Rsl \geq 1923\Omega$$

Since the upper limit value of the variation distribution of the high-resistance state attaining voltage Vlh is 2.5V, the following condition is derived based on the formula (1):

$$Rsl \leq 2000\Omega$$

Since the lower limit value of the variation distribution of the high-resistance state attaining voltage Vlh is 1.5V, the following condition is derived from the formula (1):

$$Rsl \leq 4286\Omega$$

In summary, by setting Rsl to 1923Ω or higher, the node potential after the resistance variable element has switched to the high-resistance state can be controlled to 3.0V or lower. By controlling Rsl in a step form from 4286Ω to 2000Ω, the node potential in the state where the resistance variable element is in the low-resistance state can be swept from 1.5V to 2.5V. The value ranging from 2000Ω~4286Ω satisfies a condition of 1923Ω or larger. Therefore, after the resistance variable element has switched to the high-resistance state, the node potential is kept at 3.0Ω or lower. Therefore, it is possible to prevent an unnecessarily high voltage from being applied to the resistance variable element before and after switching of the resistance value while preventing the element from switching back to the low-resistance state after the element has switched to the high-resistance state.

Next, consider a case where the resistance variable element switches to the low-resistance state. Once the resistance variable element 22 has switched to the low-resistance state, it is necessary to prevent the resistance variable element 22 from switching back to the high-resistance state. If the voltage to be applied is beyond a lower limit value (1.5V) of the variation distribution of the high-resistance state attaining voltage Vlh, some resistance variable elements would switch back to the Since the upper limit value of the variation distribution of the low-resistance state attaining voltage Vhl is 4.0V, the following condition is derived based on the formula (3):

$$Rsh \leq 14130\Omega$$

Since the lower limit value of the variation distribution of the low-resistance state attaining pulse Vhl is 3.0V, the following condition is derived from the formula (3):

$$Rsh \leq 28261\Omega$$

In summary, by setting Rsh to 13929Ω or higher, the node potential after the resistance variable element has switched to the low-resistance state can be controlled to 1.5V or lower. By controlling Rsh in a step form from 28261Ω to 14130Ω, the node potential in the state where the resistance variable element is in the low-resistance state is swept from 3.0V to 4.0V. The value Rsl ranging from 14130Ω~28261Ω satisfies a condition of 13929Ω or higher. Therefore, after the resistance variable element has switched to the low-resistance state, the node potential is kept at 1.5Ω or lower.

Therefore, it is possible to prevent an unnecessarily high voltage from being applied to the resistance variable element before and after switching of the resistance value while preventing the element from switching back to the high-resistance state after the element has switched to the low-resistance state.

Table 1 shows switching modes of the series resistance switching circuit in Embodiment 1 of the present invention.

TABLE 1

| SW MODE | R1a 4300Ω | R1b 6880Ω | R1c 13760Ω | R1d 27520Ω | R1e 55040Ω | R2a 28500Ω | R2b 51300Ω | R2c 102600Ω | R2d 205200Ω | R2e 410400Ω | COMPOSITE RESISTANCE VALUE(Ω) |
|---|---|---|---|---|---|---|---|---|---|---|---|
| 1 | ON | OFF | OFF | OFF | OFF | OFF | OFF | OFF | OFF | OFF | 4300 |
| 2 | ON | OFF | OFF | OFF | ON | OFF | OFF | OFF | OFF | OFF | 3988 |
| 3 | ON | OFF | OFF | ON | OFF | OFF | OFF | OFF | OFF | OFF | 3719 |
| 4 | ON | OFF | OFF | ON | ON | OFF | OFF | OFF | OFF | OFF | 3484 |
| 5 | ON | OFF | ON | OFF | OFF | OFF | OFF | OFF | OFF | OFF | 3276 |
| 6 | ON | OFF | ON | OFF | ON | OFF | OFF | OFF | OFF | OFF | 3092 |
| 7 | ON | OFF | ON | ON | OFF | OFF | OFF | OFF | OFF | OFF | 2928 |
| 8 | ON | OFF | ON | ON | ON | OFF | OFF | OFF | OFF | OFF | 2780 |
| 9 | ON | ON | OFF | OFF | OFF | OFF | OFF | OFF | OFF | OFF | 2646 |
| 10 | ON | ON | OFF | OFF | ON | OFF | OFF | OFF | OFF | OFF | 2525 |
| 11 | ON | ON | OFF | ON | OFF | OFF | OFF | OFF | OFF | OFF | 2414 |
| 12 | ON | ON | OFF | ON | ON | OFF | OFF | OFF | OFF | OFF | 2313 |
| 13 | ON | ON | ON | OFF | OFF | OFF | OFF | OFF | OFF | OFF | 2219 |
| 14 | ON | ON | ON | OFF | ON | OFF | OFF | OFF | OFF | OFF | 2133 |
| 15 | ON | ON | ON | ON | OFF | OFF | OFF | OFF | OFF | OFF | 2054 |
| 16 | ON | ON | ON | ON | ON | OFF | OFF | OFF | OFF | OFF | 1980 |
| 17 | OFF | OFF | OFF | OFF | OFF | ON | OFF | OFF | OFF | OFF | 28500 |
| 18 | OFF | OFF | OFF | OFF | OFF | ON | OFF | OFF | OFF | ON | 26649 |
| 19 | OFF | OFF | OFF | OFF | OFF | ON | OFF | OFF | ON | OFF | 25024 |
| 20 | OFF | OFF | OFF | OFF | OFF | ON | OFF | OFF | ON | ON | 23586 |
| 21 | OFF | OFF | OFF | OFF | OFF | ON | OFF | ON | OFF | OFF | 22304 |
| 22 | OFF | OFF | OFF | OFF | OFF | ON | OFF | ON | OFF | ON | 21155 |
| 23 | OFF | OFF | OFF | OFF | OFF | ON | OFF | ON | ON | OFF | 20118 |
| 24 | OFF | OFF | OFF | OFF | OFF | ON | OFF | ON | ON | ON | 19178 |
| 25 | OFF | OFF | OFF | OFF | OFF | ON | ON | OFF | OFF | OFF | 18321 |
| 26 | OFF | OFF | OFF | OFF | OFF | ON | ON | OFF | OFF | ON | 17538 |
| 27 | OFF | OFF | OFF | OFF | OFF | ON | ON | OFF | ON | OFF | 16820 |
| 28 | OFF | OFF | OFF | OFF | OFF | ON | ON | OFF | ON | ON | 16157 |
| 29 | OFF | OFF | OFF | OFF | OFF | ON | ON | ON | OFF | OFF | 15545 |
| 30 | OFF | OFF | OFF | OFF | OFF | ON | ON | ON | OFF | ON | 14978 |
| 31 | OFF | OFF | OFF | OFF | OFF | ON | ON | ON | ON | OFF | 14451 |
| 32 | OFF | OFF | OFF | OFF | OFF | ON | ON | ON | ON | ON | 13959 | low-resistance state. Therefore, it is necessary to set the node potential lower than 1.5V. Therefore, Vlmax=1.5V. When Rph=65000Ω, the following condition is derived based on the formula (6):

$$Rsh \geq 13929\Omega$$

As shown in table 1, resistance value (Rsha) of R1a is set to 4300Ω, resistance value (Rshba) of R1b is set to 6880Ω, resistance value (Rshc) of R1c is set to 13760Ω, resistance value (Rshd) of R1d is set to 27520Ω, resistance value (Rshe) of R1e is set to 55040Ω, resistance value of R2a (Rsla) is set to 28500Ω, resistance value (Rslb) of R2b is set to 51300Ω, resistance value (Rslc) of R2c is set to 10260Ω, resistance value (Rsld) of R2d is set to 20520Ω, and resistance value (Rsle) of R2e is set to 41040Ω. α is set to 1.25 and β is set to about 1.11. This calculation is easy and will not be described in detail. The above resistance values are set and composite resistance values of the series resistance path in SW modes 1~32 are illustrated at rightmost column.

The number of resistance paths and specific resistance values of the resistive elements in the series resistance switching circuit 310 are not limited to those illustrated above. For example, each of the Rsh ladder resistance group 312 and Rsl ladder resistance group 313 may include two resistance paths.

Figure 8:
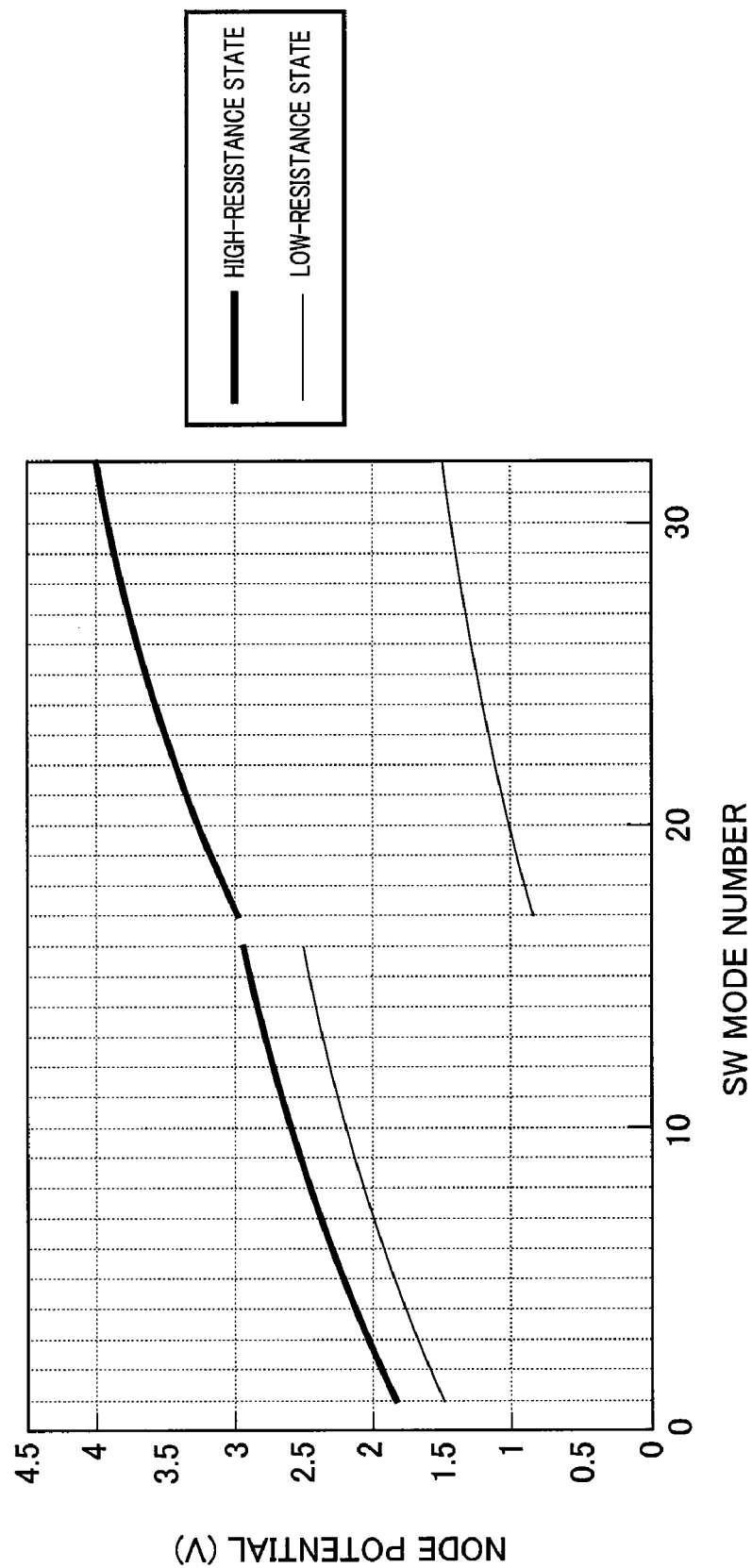
FIG. 8 is a graph showing a node potential in a case where the electric pulse is applied in each SW mode shown in table 1.
Figure 9:
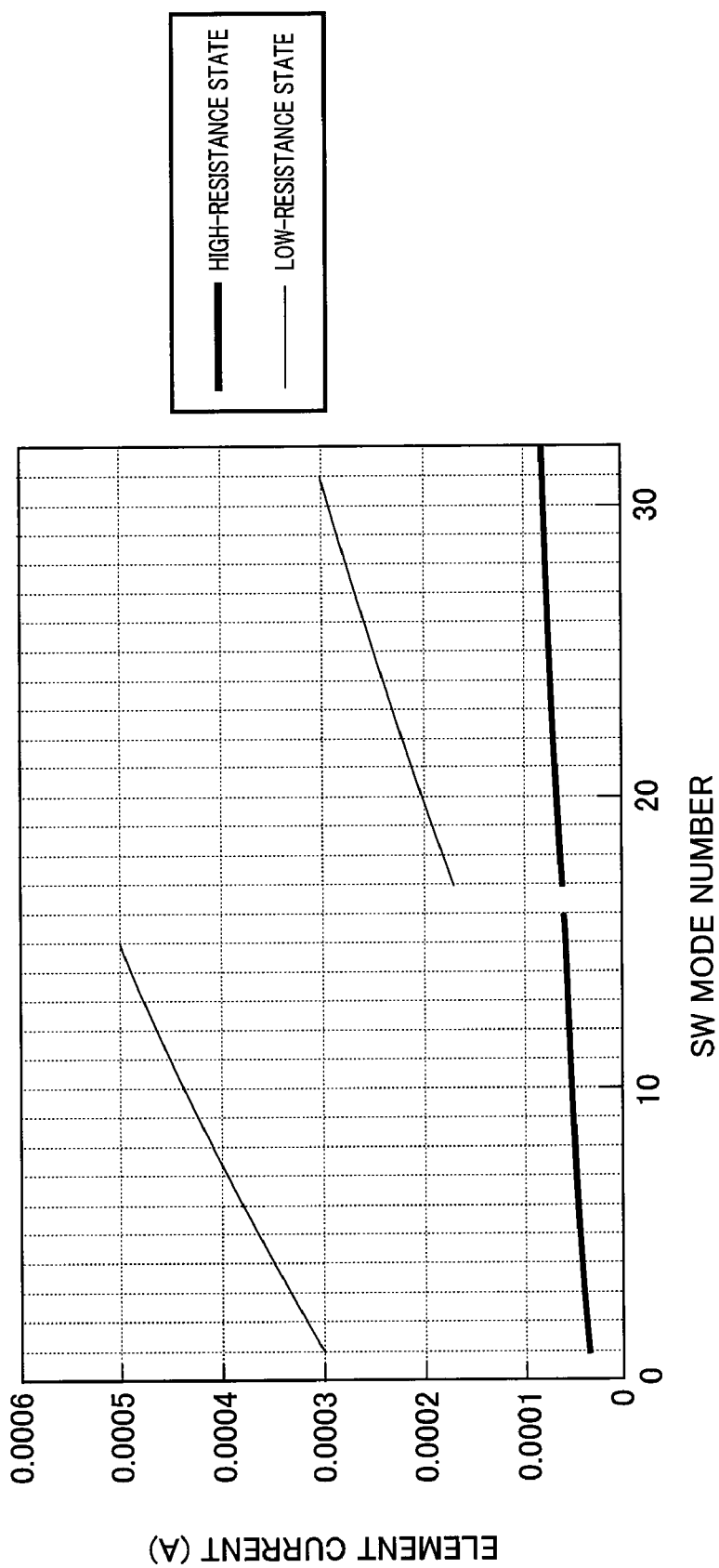
FIG. 9 is a graph showing a current (element current) flowing through a resistance variable element in a case where the electric pulse is applied in each SW mode shown in FIG. 1.

FIG. 8 is a graph showing a node potential in the case where the electric pulse is applied in the respective SW modes illustrated in table 1. FIG. 9 is a graph showing a current (element current) flowing in the resistance variable element in the case where the electric pulse is applied in the respective SW modes illustrated in table 1. In FIGS. 8 and 9, solid lines indicate a case where the resistance variable element is in the high-resistance state and thin lines indicate a case where the resistance variable element is in the low-resistance state. The SW modes 1~16 are modes in which the resistance variable element switches to the high-resistance state and the SW modes 17~32 are modes in which the resistance variable element switches to the low-resistance state.

As can be seen from FIG. 8, by switching the SW mode from 1 to 16 sequentially, i.e., by changing (herein reducing) the composite resistance value of the series current path with time, the node potential increases in a step form from the lower limit (1.5V) of the variation distribution of the high-resistance state attaining voltage to the upper limit (2.5V) of the variation distribution. In any one of the SW modes 1~16, the node potential does not exceed 3.0V after the resistance variable element has switched to the high-resistance state. As can be seen from FIG. 9, in any one of the SW modes 1~16, the current flowing through the resistance variable element is restricted to a small one and a electrical stress applied to the resistance variable element is reduced, after the resistance variable element has switched to the high-resistance state. To switch the resistance variable element to the high-resistance state, the node potential is sequentially swept from the small value to the large value by sequentially switching the SW mode from 1 to 16. A low voltage is firstly applied to the resistance variable element and the voltage applied to the same gradually increases in magnitude. With such an operation, each resistance variable element switches to the high-resistance state by its optimal voltage value. After the resistance variable element has switched to the high-resistance state, the electrical stress is reduced by transferring a current to the parallel current path.

As can be clearly seen from FIG. 8, by switching the SW mode sequentially from 17 to 32, i.e., by changing (herein reducing) the composite resistance value of the series current path with time, the node potential increases in a step form from the lower limit (3.0V) of the variation distribution of the low-resistance state attaining voltage to the upper limit (4.0V) of the variation distribution. In any one of the SW modes 17~32, the node potential does not exceed 1.5V after the resistance variable element has switched to the low-resistance state. As can be seen from FIG. 9, in any one of the SW modes 17±32, the current flowing through the resistance variable element is restricted to a low one and a electrical stress applied to the resistance variable element is reduced, after the resistance variable element has switched to the low-resistance state. To switch the resistance variable element to the low-resistance state, the node potential is sequentially swept from the low value to the high value by switching the SW mode sequentially from 17 to 32. A low voltage is firstly applied to the resistance variable element and the voltage applied to the same gradually increases in magnitude. With such an operation, each resistance variable element switches to the low-resistance state by its optimal voltage value. After the resistance variable element has switched to the low-resistance state, the current is suppressed by dropping a potential in the series current path. Thus, a electrical stress applied to the resistance variable element is reduced.

When the resistance variable element is switched to the high-resistance state or to the low-resistance state, the SW mode may be switched in the state where the electric pulse is being applied to the resistance variable element. Or, the SW mode may be switched between plural electric pulses of a predetermined pulse width which are applied to a single resistance variable element. Or, the electric pulses may be applied to plural resistance variable elements with the SW mode fixed, thereafter the SW mode may be switched and the electric pulse may be applied to the same plural resistance variable elements in a new SW mode. In other words, the SW mode may be switched for each set of the plural resistance variable elements. It is sufficient that the resistance value of the series current path is changed in a predetermined range in at least one of the case where the resistance variable element is switched from the low-resistance state to the high-resistance state and the case where the resistance variable element is switched from the high-resistance state to the low-resistance state. The specific voltage application method and the switching timing of the SW mode are not limited.

[Operation and Data Writing Method]

Hereinafter, the operation and data writing method of the nonvolatile memory device 300 will be described with reference to FIG. 5. Hereinafter, it is assumed that a memory cell connected to the word line WL1 and to the bit line BL1 is a selected memory cell.

The controller 80 extracts row information from a received address, and sends ROW signal to the row decoder 66 based on the extracted information. The row decoder 66 decodes the received ROW signal and outputs a row address to the word line driver 68. The word line driver 68 applies an ON-voltage to the word line WL1 based on the row address received. All of the select transistors 21 connected to the word line WL1 are placed in an electrically conductive state, and the memory cells 20 on the row are respectively rendered accessible.

The controller 80 extracts column information from the received address and sends to the switch controller 74, COLUMN signal based on the extracted information and a signal (MODE) indicating whether a control command is "write" or "read."

The switch controller 74 decodes the received COLUMN signal to obtain a column address. The switch controller 74 controls the multi-switch circuit 75 based on the obtained column address to connect the bit line BL1 to the fourth node 94 or to the comparator/determiner circuit 72. When the MODE signal indicates "write," the bit line BL1 is connected to the write pulse drive circuit 50 via the series resistance switching circuit 10 or electrically grounded via the parallel resistance switching circuit 30.

As described above, in this Embodiment, the word line WL1 and the bit line BL1 are selected to select a specified memory cell 20. The switch controller 74 turns ON the switch Sb1w to select the bit line 71.

When the switch control and the selection of the memory cell are complete, writing or reading of data are performed. When the MODE signal indicates "write," the controller 80 controls the write pulse drive circuit 50 to output a predetermined voltage between the first output terminal 51 and the second output terminal 2. The switch controller 74 controls the switches in the series resistance switching circuit 310 and the parallel resistance switching circuit 30 based on the value of write data received. To be specific, when the write data is "0," the parallel resistor selector switch for low-resistance change 32 is turned ON and the parallel resistor selector switch for high-resistance change 34 is turned OFF, to switch the resistance variable element to switch to the high-resistance state. Then, the SW mode of the series resistance switching circuit 310 is switched sequentially from 16 to 1. Thereby, the resistance value of the series resistance switching circuit 310 changes in a step form from 4300Ω to 1980Ω and the node potential changes in a step form from the lower limit (1.5V) of Vlh to the upper limit (2.5V) of Vlh. When the write data is "1," the parallel resistor selector switch for high-resistance change 34 is turned ON and the parallel resistor selector switch for low-resistance change 32 is turned OFF, to switch the resistance variable element 22 to switch to the low-resistance state. Then, the SW mode of the series resistance switching circuit 310 is switched sequentially from 32 to 17. Thereby, the resistance value of the series resistance switching circuit 310 changes in a step form from 28500Ω to 13959Ω and the node potential changes in a step form from the lower limit (3.0V) of Vhl to the upper limit (4.0V) of Vhl.

When writing data, the data is written to a desired memory cell 20 with the above operation. The relationship between the resistance value and the voltage and a principle of a write operation are similar to those of Configuration 1 and will not be described repetitively When reading data, the MODE signal indicates "read." The controller 80 controls the switch controller 74 to turn ON the switch Sb1r so that the bit line BL1 is connected to the read comparator/determiner circuit 72. The controller 80 controls the comparator/determiner circuit 72 to apply a specified read electric pulse to the selected memory cell 20 and to detect a current flowing therein for determination. This detection circuit is implemented by a very general technique and will not be described in detail. A detection method using a detection circuit such as a current mirror is a standard example. The determination result (read data) is output to an external system via the controller 80.

[Advantage]

With the above described configuration and operation, the nonvolatile memory device 300 of Embodiment 1 of the present invention achieves the same advantages of Configuration 1 and Configuration 2.

In addition, the nonvolatile memory device 300 achieves the advantages described below. Since the series resistance switching circuit is configured to change the resistance value in a step form within a predetermined range, the node potential can be controlled in a wide range according to the variation distribution of the high-resistance state attaining voltage or the variation distribution of the low-resistance state attaining voltage of the respective variable elements in the memory cell array. Therefore, a write failure can be prevented and reduction of a storage capacity can be prevented. Reliability of the operation can be improved. Since the electrical stress applied to the resistance variable elements is suppressed to a minimum one for every individual resistance variable element, the life of the resistance variable element can be extended.

In each of the case where the resistance variable element is switched to high-resistance state and the case where the resistance variable element is switched to the low-resistance state, the node potential is swept from the lower limit to the upper limit, and thus the resistance variable element selects its optimal voltage to change the resistance value. With such an operation, the electrical stress applied to every individual resistance variable element is suppressed to a minimum one, and the life of the resistance variable element or the memory cell array can be extended.

In this Embodiment, the voltage is swept in a predetermined step according to the variation distribution of Vlh or Vhl. Assuming that a difference in voltage between the steps is constant, the number of steps for writing data increases as the variation in Vlh or Vhl increases. Assuming that the required time is equal between the steps, the write speed is slower in a memory device in which a variation in Vlh or Vhl is large, while high-speed writing is achieved in a memory device in which a variation in Vlh or Vhl is small, because of a decrease in the number of steps. In a mass production process of the memory device, a memory device which has a high write speed can be shipped as a more expensive product of a high added-value and a memory device which has a slow write speed can be shipped as a more inexpensive product. In this Embodiment, if it is found out in a final inspection step that a certain memory cell array is a memory cell array with a small variation, the controller 80 is set so that the range of change of the node potential is small (step number is fewer) and the memory cell array is completed as a high-speed product. On the other hand, if it is found out in a final inspection step that a certain memory cell array is a memory cell array with a large variation, the controller 80 is set so that the range of change of the node potential is large (step number is more) and the memory cell array is completed as a low-speed product. With such a method, a manufacturing process which minimizes a waste in mass production is achieved.

In this Embodiment, since the controller is built into the memory device, the external system is capable of writing and reading data by merely inputting an operation command, an address, and write data. As a result, the nonvolatile memory device 300 can be flexibly adapted to the external system having various interfaces and communication protocols.

[Modification]

In this Embodiment, modifications similar to those of Configuration 1 and Configuration 2 can be made.

If a variation in only either Vlh or Vhl is large and a variation in the other is small, then the node potential may be swept in either the case where the resistance variable element is switched to the high-resistance state or the case where the resistance variable element is switched to the low-resistance state. For example, if a variation in Vlh is large and Vhl is substantially constant, the node potential may be swept only in the case where the resistance variable element is switched to the high-resistance state. On the other hand, if a variation in Vhl is large and Vlh is substantially constant, the node potential may be swept only in the case where the resistance variable element is switched to the low-resistance state.

Embodiment 2

Configuration

Figure 10:
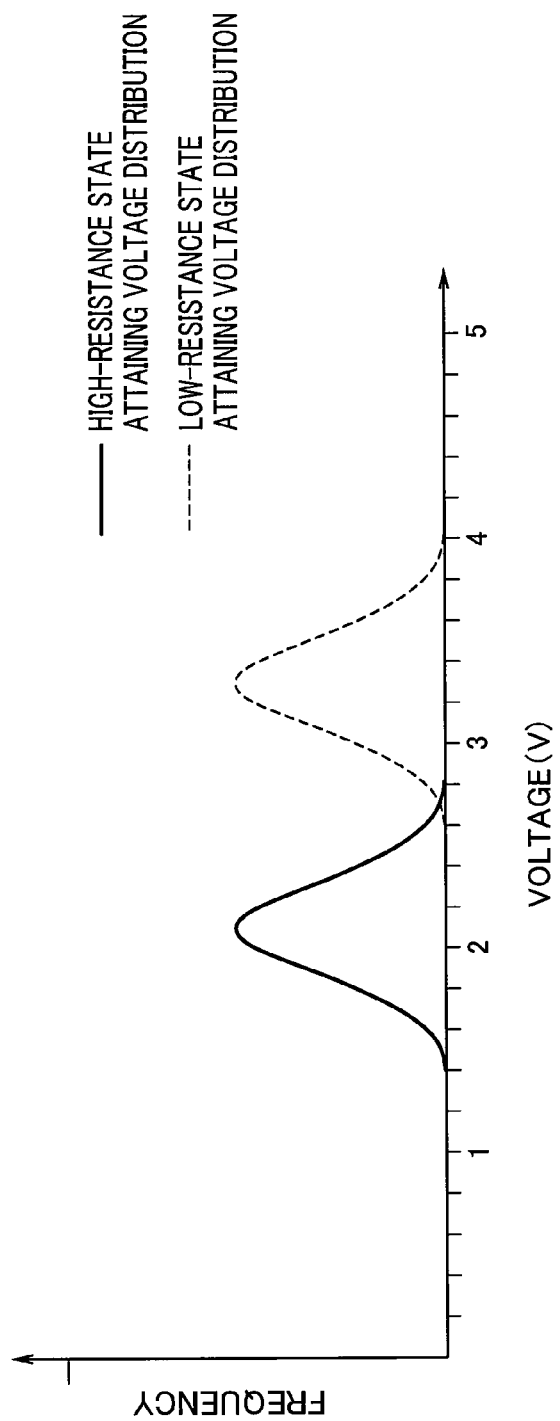
FIG. 10 is a conceptual diagram showing a distribution of a high-resistance state attaining voltage and a distribution of a low-resistance state attaining voltage of respective resistance variable elements in the memory cell array in a case where there is a significant variation.

In Embodiment 1, as shown in FIG. 6, the device is configured assuming that the distribution of Vlh and the distribution of Vhl do not overlap with each other. However, the two distributions may sometimes overlap with each other. If the distributions overlap with each other, proper control would be difficult in the configuration of Embodiment 1. FIG. 10 is a conceptual diagram showing a distribution of a high-resistance state attaining voltage and a distribution of a low-resistance state attaining voltage of resistance variable elements in the memory cell array in a case where there are significant variations in the these voltages. In the example shown in FIG. 10 in which there are significant variations, there is a tendency that an incorrect operation occurs, in which the resistance variable element which has switched to the high-resistance state switches back to the low-resistance state or the resistance variable element which has switched to the low-resistance state switches back to the high-resistance state. Consider a case where the resistance variable element switches to the high-resistance state near the lower limit (1.5V) of the distribution of Vlh, for example. Since the thickness and parasitic resistance of the resistance variable layer (e.g., thin layer of an oxide) of the same resistance variable element are the same, it is presumed that this resistance variable element switches to the low-resistance state near the lower limit (2.7V) of the distribution of Vhl. This resistance variable element switches to the high-resistance state in the state where the node potential is set to 1.5V. In Embodiment 1, the mode of the series resistance switching circuit 310 is switched after the resistance variable element has switched to the high-resistance state, and the voltage continues to be applied until the node potential reaches a highest value. If the node potential exceeds 2.7V according to the switching of the mode, the resistance variable element switches back to the low-resistance state. As a magnitude in the variation increases, the range of the voltage to be swept would be widened and the resistance value would change unintentionally. Embodiment 2 is intended to avoid such a problem.

Figure 11:
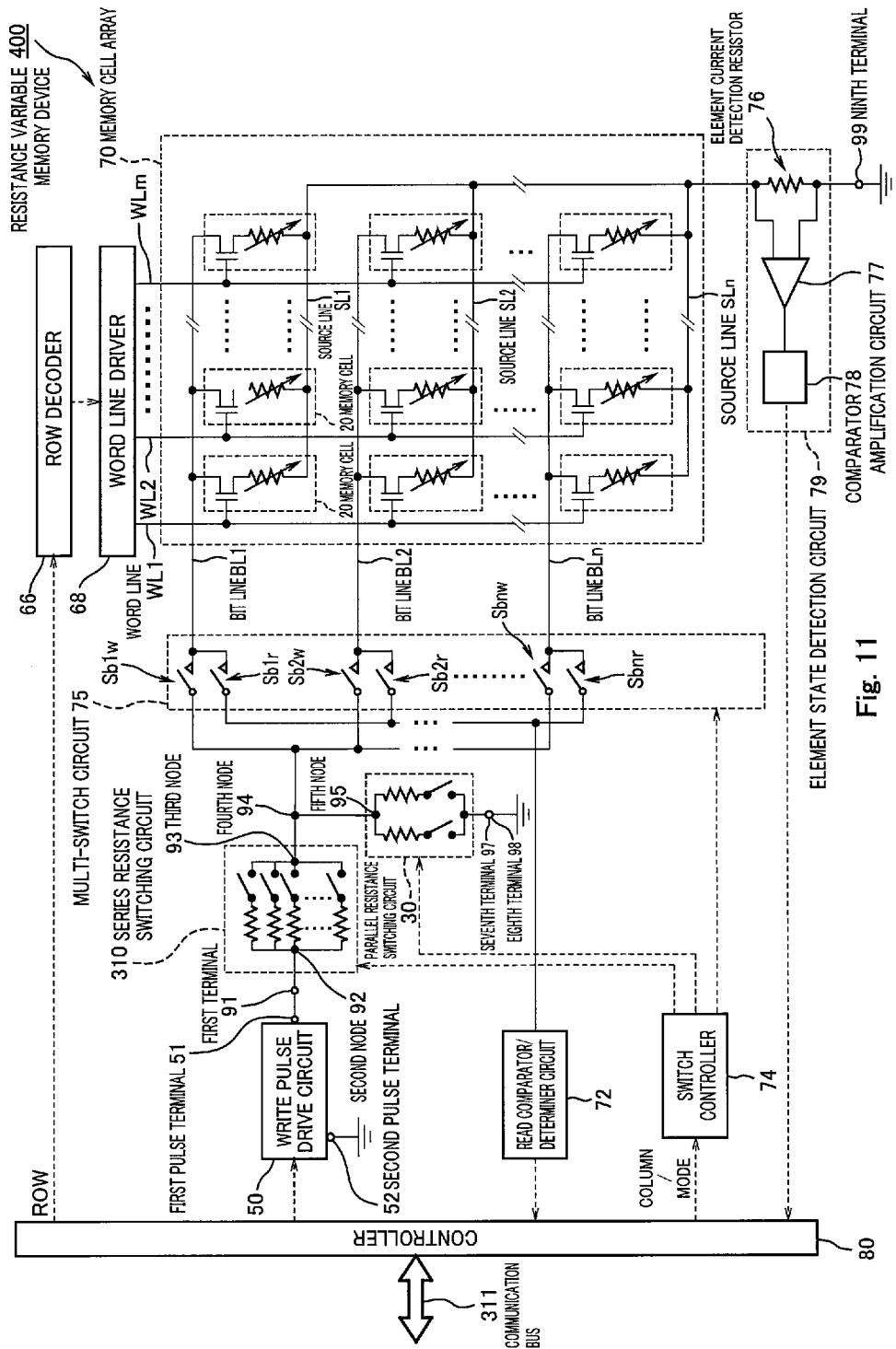
FIG. 11 is a block diagram showing an exemplary nonvolatile memory device according to Embodiment 2 of the present invention.
Figure 12:
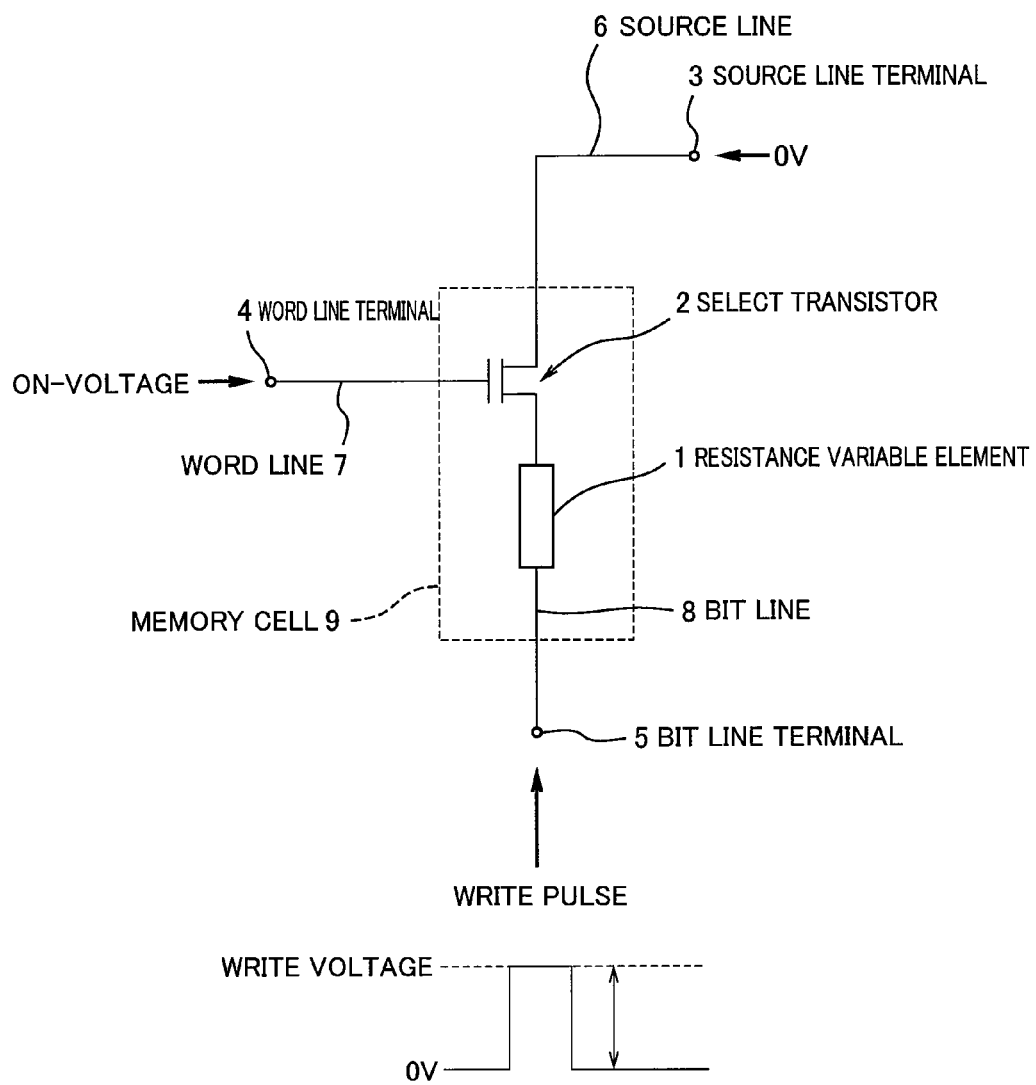
FIG. 12 is a view showing an application state of a voltage pulse applied when a write operation is performed in a memory cell of Patent document 1.
Figure 13:
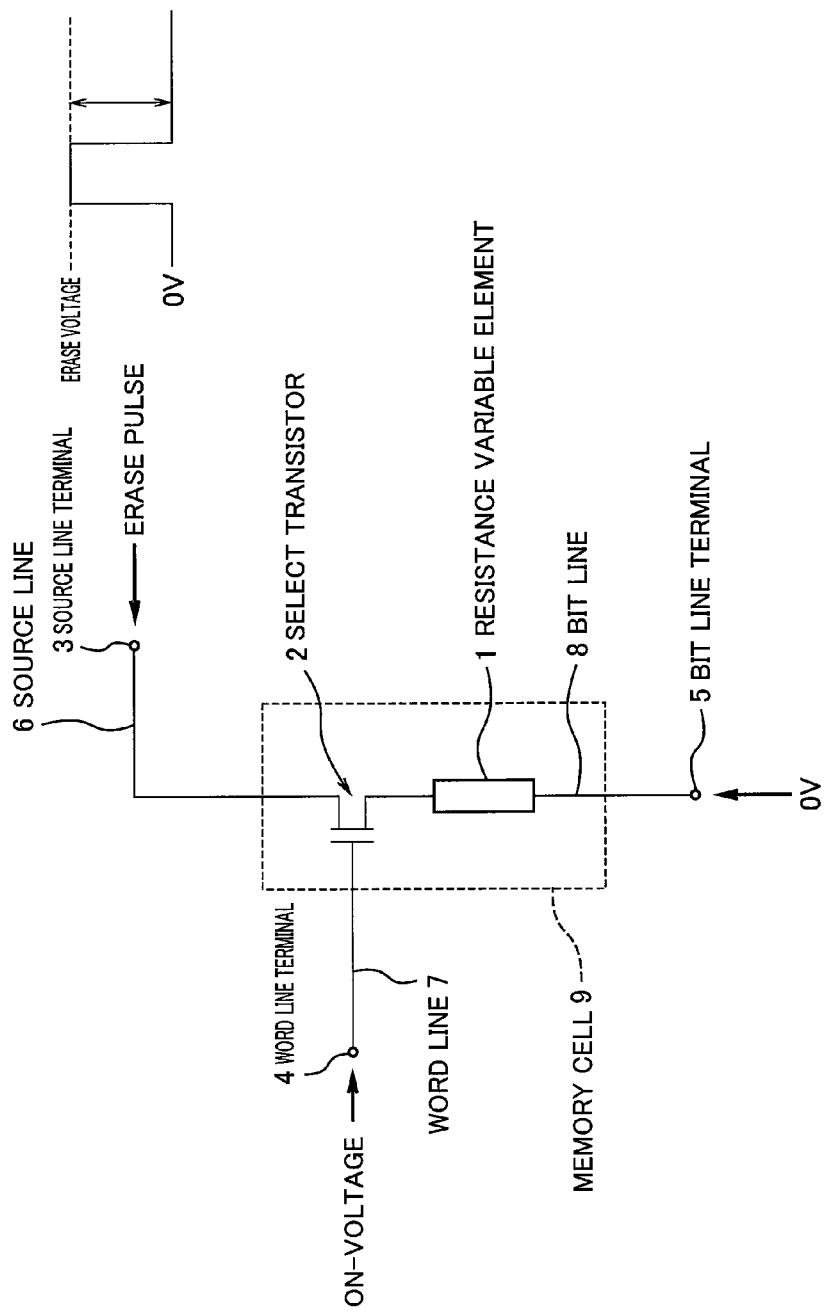
FIG. 13 is a view showing an application state of a voltage pulse applied when an erase operation is performed in the memory cell of Patent document 1.
Figure 14:
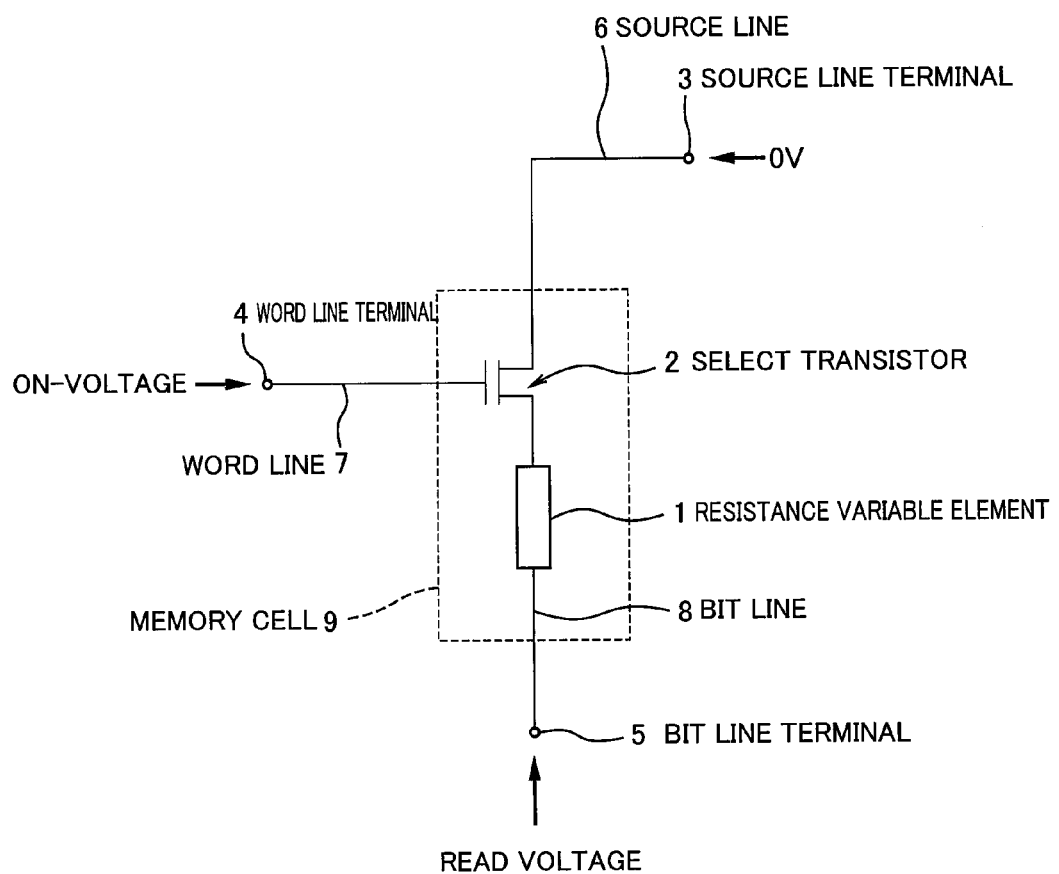
FIG. 14 is a view showing an application state of a voltage pulse applied when a read operation is performed in the memory cell of Patent document 1.

FIG. 11 is a block diagram showing an exemplary nonvolatile memory device according to Embodiment 2 of the present invention. With reference to FIG. 11, the nonvolatile memory device 400 according to this Embodiment will be described with reference to FIG. 11. The same constituents as those of Embodiment 1 (FIG. 5) are identified by the same reference numerals and names and will not be described repetitively.

In the nonvolatile memory device 300 of Embodiment 1, the source lines are directly electrically grounded, whereas in the nonvolatile memory device 400 of Embodiment 2, the source lines are electrically grounded via an element current detection resistor 76 as shown in FIG. 11. The resistance value of the element current detection resistor 76 is set smaller than the resistance value of the resistance variable element 22. An amplification circuit 77 amplifies the voltage applied between the both terminals of the element current detection resistor 76 with a predetermined magnitude. The comparator 78 compares the amplified voltage with a predetermined voltage and sends a comparison result to the controller 80. The element current detection resistor 76, the amplification circuit 77 and the comparator 78 constitute an element state detection circuit 79. The element state detection circuit 79 determines whether or not the element to which data is being written is in the high-resistance state or in the low-resistance state and sends a result to the controller 80.

[Operation and Method of Writing Data]

When the resistance variable element is switched to the low-resistance state, the node potential significantly decreases with change in the resistance value, and therefore is lower than the lower limit of the distribution of Vlh. That is, no problem will arise in the control even if the lower limit of Vlh and the upper limit of Vhl overlap with each other.

When the resistance variable element is switched to the high-resistance state, the node potential increases with a change in the resistance value. If the node potential is swept up to the upper limit of Vlh, the resistance variable element would possibly switch back to the low-resistance state. In this Embodiment, the element state detection circuit 79 detects that the resistance variable element has switched to the high-resistance state, and the controller 80 stops sweeping and transitions to writing for a subsequent address. Such control can prevent an unnecessarily high voltage from being applied to the resistance variable element before and after switching of the resistance value while preventing the element which has switched to the high-resistance state from switching back to the low-resistance state. The sweeping of the voltage may be stopped by stopping the switching of the series resistance switching circuit 310 (stopping a variation in the resistance value of the series current path) or stopping the outputting of the electric pulse from the write pulse drive circuit 50 (inputting of the electric pulse to the resistance variable element).

The operation of other constituents is similar to that of Embodiment 1 and will not be described repetitively.

[Advantage]

With the above described configuration and operation, the nonvolatile memory device 400 of Embodiment 2 of the present invention achieves the advantage similar to that of Embodiment 1.

In addition, the nonvolatile memory device 400 achieves the advantages described below. Since the controller 80 stops sweeping of the node potential at the time when the resistance variable element has switched its resistance state based on a detection result of the element state detection circuit 79, it is possible to prevent an unnecessarily high voltage from being applied to the resistance variable element before and after switching of the resistance value while preventing the element which has switched to the high-resistance state from switching back to the low-resistance state. As a result, reliability of the operation is further improved and the life of the device is extended.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A nonvolatile memory device of the present invention is useful as a nonvolatile memory device which can improve reliability of an operation and extend its life in a nonvolatile memory device including a memory cell array having plural resistance variable elements which are switchable between plural resistance states in response to electric pulses with the same polarity. A method of writing data to a nonvolatile memory device of the present invention is useful as a method of writing data to a nonvolatile memory device which can improve stability and reliability of an operation and extend the life of the device in a method of writing data to a nonvolatile memory device including a memory cell array having plural resistance variable elements which are switchable between plural resistance states in response to electric pulses with the same polarity.

The invention claimed is:

1. A nonvolatile memory device comprising:
a memory cell array including plural resistance variable elements each of which has a first terminal and a second terminal and is configured to store data based on switching in an electric resistance between the first terminal and the second terminal;
an electric pulse application circuit which includes a first output terminal and a second output terminal and is configured to output an electric pulse between the first output terminal and the second output terminal;

a select circuit which is configured to select a desired resistance variable element from resistance variable elements in the memory cell array as a selected resistance variable element, electrically connect the first terminal of the selected resistance variable element to the first output terminal, and electrically connect the second terminal of the selected resistance variable element to the second output terminal;

a series resistance setting unit configured to set a resistance value of a series current path as desired, the series current path being a current path electrically connecting the first output terminal to a reference node, the reference node being a point on a current path connecting the first output terminal to the first terminal of the selected resistance variable element, a potential between the second output terminal and the reference node being a node potential; and a control circuit configured to control the series resistance setting unit to set the resistance value of the series current path;

wherein the node potential is obtained by dividing a voltage between the first and the second output terminals by at least the resistance value of the series resistance setting unit and the resistance value of the selected resistance variable element;

wherein each of the resistance variable elements has a characteristic in which the resistance variable element in a low-resistance state switches to a high-resistance state in which a resistance value of the resistance variable element is higher than a resistance value of the resistance variable element in the low-resistance state, when the node potential is higher in absolute value than a first voltage level corresponding to each of the resistance variable elements, and the resistance variable element in the high-resistance state switches from the high-resistance state to the low-resistance state when the node potential is higher in absolute value than a second voltage level which is identical in polarity to the first voltage level, corresponds to each of the resistance variable elements and is higher in absolute value than the first voltage level; and wherein the control circuit is configured to perform control for at least one of:

(A) changing the resistance value of the series current path within a predetermined range with time so that the node potential falls within a predetermined range between a lower limit of a variation distribution of the first voltage level in the memory cell array and an upper limit of the variation distribution in a state where the resistance variable element is in the low-resistance state and is lower than the lower limit of the variation distribution of the second voltage level after the resistance variable element has switched to the high-resistance state when the resistance variable element is switched from the low-resistance state to the high-resistance state; and (B) changing the resistance value of the series current path within a predetermined range with time so that the node potential falls within a predetermined range between a lower limit of the variation distribution of the second voltage level in the memory cell array and an upper limit of the variation distribution in a state where the resistance variable element is in the high-resistance state and is lower than the lower limit of the variation distribution of the first voltage level after the resistance variable element has switched to the low-resistance state when the resistance variable element is switched from the high-resistance state to the low-resistance state.

2. The nonvolatile memory device according to claim 1, further comprising:

a parallel current path for electrically connecting the reference node to the second output terminal in parallel with the resistance variable element; and a parallel resistance setting unit for setting a resistance value of the parallel current path as desired;

wherein the control circuit is configured to control the parallel resistance setting unit such that the resistance value of the parallel current path is changed within a predetermined range with time to selectively adjust the node potential in at least one of a case where the resistance variable element is switched from the low-resistance state to the high-resistance state and a case where the resistance variable element is switched from the high-resistance state to the low-resistance state.

3. The nonvolatile memory device according to claim 1, wherein the series resistance setting unit includes plural resistive elements, and is configured to selectively connect one of the plural resistive elements in parallel with the series current path to change the resistance value of the series current path in a step form within the predetermined range with time.

4. The nonvolatile memory device according to claim 1, further comprising:

a controller being configured to control the series resistance setting unit to change the resistance value of the series current path within the predetermined range with time during a time period from when application of the electric pulse to the resistance variable element starts until the application of the electric pulse completes in at least one of the case where the resistance variable element is switched from the low-resistance state to the high-resistance state and the case where the resistance variable element is switched from the high-resistance state to the low-resistance state.

5. The nonvolatile memory device according to claim 1, further comprising:

a controller being configured to change the resistance value of the series current path in a step form within the predetermined range with time and configured to cause the electric pulse application unit to output a predetermined electric pulse at each time when the resistance value of the series current path is changed in one step in at least one of the case where the resistance variable element is switched from the low-resistance state to the high-resistance state and the case where the resistance variable element is switched from the high-resistance state to the low-resistance state.

6. The nonvolatile memory device according to claim 1, wherein a current path including the resistance variable element and electrically connecting the reference node to the second output terminal via the resistance variable element is a resistance switching current path;

a current path electrically connecting the reference node to the second output terminal in parallel with the resistance switching current path is a parallel current path; the nonvolatile memory device further comprising:

a parallel resistance setting unit for setting a resistance value of the parallel current path;

wherein the series resistance setting unit is configured to set the resistance value of the series current path and the parallel resistance setting unit is configured to set the resistance value of the parallel current path so that:

the resistance value of the series current path, the resistance value of the parallel current path, a resistance value of the resistance switching current path in a state where the resistance variable element is in the high-resistance state and a resistance value of the resistance switching current path in a state where the resistance variable element is in the low-resistance state are set to values so that:

the node potential is not lower in absolute value than the first voltage level when the electric pulse application unit is outputting a first electric pulse in a state where the resistance variable element is in the low-resistance state;

the node potential is not lower in absolute value than the second voltage level when the electric pulse application unit is outputting a second electric pulse in a state where the resistance variable element is in the high-resistance state;

after the resistance variable element in the low-resistance state has switched to the high-resistance state in response to the first electric pulse output from the electric pulse application unit, the node potential is lower in absolute value than the second voltage level even though the electric pulse application unit is outputting the first electric pulse; and after the resistance variable element in the high-resistance state has switched to the low-resistance state in response to the second electric pulse output from the electric pulse application unit, the node potential is lower in absolute value than the first voltage level even though the electric pulse application unit is outputting the second electric pulse.

7. The nonvolatile memory device according to claim 2, wherein a variation distribution of the first voltage level in the memory cell array overlaps with a variation distribution of the second voltage level in the memory cell array, the nonvolatile memory device further comprising:

a resistance switching detector for detecting that the resistance variable element selected by the selector unit has switched from the low-resistance state to the high-resistance state; and a controller;

wherein the controller is configured to cause the series resistance setting unit to change the resistance value of the series current path within the predetermined range with time such that the node potential gradually increases from a lower limit of the variation distribution of the first voltage level in the memory cell array, and cause the resistance switching detector to monitor a resistance state of the resistance variable element; and wherein the controller is configured to stop inputting of the electric pulse to the resistance variable element or stop changing of the resistance value of the series current path, when the resistance switching detector detects that the resistance variable element has switched to the high-resistance state.

8. A method of writing data to a nonvolatile memory device including: a memory cell array including plural resistance variable elements for storing data based on switching of electric resistance; an electric pulse application unit including a first output terminal and a second output terminal and configured to output an electric pulse between the first output terminal and the second output terminal; and a selector unit which is connected to the first output terminal and configured to select a desired resistance variable element from resistance variable elements in the memory cell array and connect the selected resistance variable element to the first output terminal; wherein a current path electrically connecting the first output terminal to a reference node is a series current path, the reference node being a point on a current path connecting the first output terminal to the selector unit; and each of the resistance variable elements has a characteristic in which, in a state where the resistance variable element is in the low-resistance state, the resistance variable element switches to a high-resistance state in which a resistance value of the resistance variable element is higher than a resistance value of the resistance variable element in the low-resistance state, when a node potential which is a potential of the reference node on the basis of the second output terminal is higher in absolute value than a first voltage level corresponding to the resistance variable element; and in a state where the resistance variable element is in the high-resistance state, the resistance variable element switches from the high-resistance state to the low-resistance state when the node potential is higher in absolute value than a second voltage level which is identical in polarity to the first voltage level, is higher in absolute value than the first voltage level and corresponds to the resistance variable element, the method comprising:

changing the resistance value of the series current path within a predetermined range with time in at least one of a case where the resistance variable element switches from the low-resistance state to the high-resistance state and a case where the resistance variable element switches from the high-resistance state to the low-resistance state.

* * * * *